(12) United States Patent
Aparin et al.

(10) Patent No.: US 11,984,916 B2
(45) Date of Patent: May 14, 2024

(54) TRANSMISSION SETTING SELECTION

(71) Applicant: Qualcomm Incorporated, San Diego, CA (US)

(72) Inventors: Vladimir Aparin, San Diego, CA (US); Aidin Bassam, San Diego, CA (US); Nicholas Michael Carbone, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 64 days.

(21) Appl. No.: 17/485,047

(22) Filed: Sep. 24, 2021

(65) Prior Publication Data

US 2023/0102955 A1 Mar. 30, 2023

(51) Int. Cl.
*H04B 1/04* (2006.01)
*H04B 1/62* (2006.01)

(52) U.S. Cl.
CPC ............... *H04B 1/04* (2013.01); *H04B 1/62* (2013.01); *H04B 2001/0416* (2013.01)

(58) Field of Classification Search
CPC ............... H03F 1/0222; H03F 1/3247; H03F 2200/451; H04B 1/04; H04B 1/62; H04B 2001/0416; H04B 2001/0425; H04B 2001/0433; H04B 2001/045
USPC .................................................. 375/296, 297
See application file for complete search history.

(56) References Cited

U.S. PATENT DOCUMENTS

| | | |
|---|---|---|
| 2006/0209984 A1 | 9/2006 | Kenington |
| 2012/0100897 A1 | 4/2012 | Chen |
| 2012/0105150 A1 | 5/2012 | Wimpenny |
| 2012/0219048 A1 | 8/2012 | Camuffo et al. |
| 2014/0018022 A1* | 1/2014 | Xu .................. H04W 52/52 455/127.2 |
| 2014/0187182 A1 | 7/2014 | Yan et al. |
| 2016/0072530 A1 | 3/2016 | El-Hassan et al. |
| 2017/0047900 A1* | 2/2017 | Lokas .................. H03F 1/3247 |
| 2019/0363676 A1 | 11/2019 | Megretski et al. |

OTHER PUBLICATIONS

International Search Report and Written Opinion—PCT/US2022/075920—ISA/EPO—dated Jan. 2, 2023, 11 pages.

* cited by examiner

*Primary Examiner* — David S Huang
(74) *Attorney, Agent, or Firm* — Colby Nipper/Qualcomm Incorporated

(57) ABSTRACT

An apparatus is disclosed for transmission setting selection. In an example aspect, an apparatus includes a wireless interface device with a communication processor and a radio-frequency front-end. The communication processor is configured to provide a signal. The radio-frequency front-end is coupled to the communication processor and configured to accept the signal. The radio-frequency front-end includes an amplifier configured to amplify the signal based on one or more amplifier settings. The wireless interface device is configured to adjust the one or more amplifier settings responsive to an output power being changed with a gain being unchanged.

30 Claims, 15 Drawing Sheets

800-1

| Freq | Pout | Amp settings–sequential |||||
|---|---|---|---|---|---|---|
| | | G | $P_{sg}$ | $V_{cc1}$ | $I_{Q1}$ | $I_{Q2}$ |
| 801 | | | | | | |
| xyz MHZ | 2 | 2 | -5 | 0.5 | 2 | 8 |
| | 3 | 2 | -4 | 0.5 | 2 | 8 |
| | 4 | 1 | -3 | 0.6 | 3 | 9 |
| | ... | | | ... | | |

| Freq | Pout | Amp settings–jointly |||||
|---|---|---|---|---|---|---|
| | | G | $P_{sg}$ | $V_{CC1}$ | $I_{Q1}$ | $I_{Q2}$ |
| 802 | | | | | | |
| xyz MHZ | 2 | 2 | -5 | 0.4 | 2 | 8 |
| | 3 | 2 | -4 | 0.5 | 3 | 8 |
| | 4 | 1 | -3 | 0.6 | 3 | 9 |
| | ... | | | ... | | |

804

Look-Up Table (LUT) 510

FIG. 8-2

TRANSMISSION SETTING SELECTION

TECHNICAL FIELD

This disclosure relates generally to electronic devices and, more specifically, to selecting a transmission setting.

BACKGROUND

Electronic devices include traditional computing devices such as desktop computers, notebook computers, smartphones, wearable devices like smartwatches, and internet servers. However, electronic devices also include other types of computing devices, such as personal voice assistants (e.g., smart speakers), wireless access points or routers, thermostats or other automated controllers, robotics, automotive electronics, devices embedded in other machines like refrigerators and industrial tools, and Internet of Things (IoT) devices. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi® network, or a cellular network. Electronic communications can therefore include both wireless and wired transmissions and receptions. To make such electronic communications, an electronic device can use a transceiver, such as a wireless transceiver for wireless communications.

Wireless electronic communications can be realized by propagating signals between two wireless transceivers at two different electronic devices. For example, using a wireless transmitter, a smartphone can transmit a wireless signal to a base station of a cellular network over the air as part of an uplink communication to support mobile services. Using a wireless receiver, the smartphone can receive a wireless signal that is transmitted from the base station as part of a downlink communication to enable mobile services. With a smartphone, mobile services can include making audio and video calls, participating in social media interactions, sending messages, watching movies, sharing videos, performing searches, acquiring map information or navigational instructions, finding friends, engaging in location-based services generally, transferring money, and obtaining another service like a car ride. Other services that can be enhanced with wireless communications include self-driving vehicles, augmented reality (AR) and other mixed reality (MR) imaging, on-the-go 4K video streaming, ubiquitous sensors to keep people safe and to use natural resources more efficiently, real-time language translations, and so forth.

Many of these mobile services depend at least partly on the transmission and reception of wireless signals between two or more electronic devices. Consequently, electrical engineers and other designers of wireless devices strive to develop wireless communication hardware and associated technologies that enable wireless signals to be used effectively to provide these and other mobile services.

SUMMARY

The available transmission settings for different components of a wireless interface device may be determined sequentially. If so, then a set of transmission settings that an electronic device is currently using for transmission may remain constant while the output power changes. This may result in lower power efficiency. To increase power efficiency and thereby lower power usage during signal transmissions, this document describes determining multiple transmission settings jointly instead of sequentially. For example, digital pre-distortion (DPD) settings and amplifier settings can be determined jointly based on power efficiency. Transmission settings may also include envelope tracking (ET) settings and transceiver settings. Engineers can jointly determine the transmission settings during initial design and testing on a per-design basis with the determined transmission settings stored in a look-up table (LUT) of a wireless interface device. Additionally or alternatively, a manufacturer can determine the transmission settings as part of a calibration procedure during manufacturing on a per-device basis, and/or an electronic device can jointly determine the transmission settings as part of a tuning procedure while the device is deployed in the field to account for a changing operating environment.

To realize the increased power efficiency of jointly determined transmission settings, a wireless interface device can obtain transmission settings from the LUT while an electronic device is in use. Due at least partially to the joint determination process, one or more transmission settings that are stored in the LUT can be different between different output powers under a common gain. Transmission settings may also differ between different modulation schemes and/or in dependence on whether DPD is currently active. Examples of such different transmission settings include amplifier settings, like a bias setting (e.g., a quiescent current) of a transistor of a power amplifier in a radio-frequency (RF) front-end of the wireless interface device. By adjusting amplifier settings between output power changes, for instance, a wireless interface device can activate transmission settings that increase power efficiency and thereby improve power conservation, which can extend the battery life of mobile electronic devices.

In an example aspect, an apparatus for transmission setting selection is disclosed. The apparatus includes a wireless interface device that includes a communication processor and a radio-frequency front-end. The communication processor is configured to provide a signal. The radio-frequency front-end is coupled to the communication processor and configured to accept the signal. The radio-frequency front-end includes an amplifier configured to amplify the signal based on one or more amplifier settings. The wireless interface device is configured to adjust the one or more amplifier settings responsive to an output power being changed with a gain being unchanged.

In an example aspect, an apparatus for selecting efficient transmission settings is disclosed. The apparatus includes means for activating a first group of multiple settings for a wireless interface device, with the first group of multiple settings corresponding to a first output power and including a gain and one or more first amplifier settings. The apparatus also includes means for amplifying a first signal based on the one or more first amplifier settings and the gain. The apparatus additionally includes means for activating a second group of multiple settings for the wireless interface device. The second group of multiple settings corresponds to a second output power and includes the gain and one or more second amplifier settings. The one or more second amplifier settings are different from the one or more first amplifier settings. The apparatus further includes means for amplifying a second signal based on the one or more second amplifier settings and the gain.

In an example aspect, a method for selecting efficient transmission settings is disclosed. The method includes activating a first group of multiple settings for a wireless interface device, with the first group of multiple settings corresponding to a first output power and including a gain and one or more first amplifier settings. The method also includes amplifying a first signal based on the one or more first amplifier settings and the gain. The method additionally includes activating a second group of multiple settings for the wireless interface device. The second group of multiple settings corresponds to a second output power and includes the gain and one or more second amplifier settings. The one or more second amplifier settings are different from the one or more first amplifier settings, and the second output power is different from the first output power. The method further includes amplifying a second signal based on the one or more second amplifier settings and the gain.

In an example aspect, an apparatus for transmission setting selection is disclosed. The apparatus includes a wireless interface device that includes a communication processor and a radio-frequency front-end. The communication processor includes a digital pre-distorter (DPD) configured to pre-distort a signal using one or more DPD settings to produce a pre-distorted signal. The radio-frequency front-end is coupled to the communication processor and configured to accept the pre-distorted signal. The radio-frequency front-end includes an amplifier configured to amplify the pre-distorted signal based on one or more amplifier settings. The wireless interface device is configured to adjust the one or more DPD settings responsive to an output power being changed with a gain being unchanged.

BRIEF DESCRIPTION OF DRAWINGS

FIGS. 7-1 and 7-2 illustrate an example look-up table (LUT) that can be used to implement transmission setting selection.

FIG. 8-1 illustrates an alternative LUT having identical amplifier settings with changing output powers under a common gain, which may result from sequential determination of device settings.

FIG. 8-2 illustrates an example LUT having varying amplifier settings with changing output powers under a common gain that can be used to implement transmission setting selection.

FIGS. 9-1 to 9-4 depict example graphs of certain operational metrics, such as power consumption, adjacent channel leakage ratio (ACLR), and error vector magnitude (EVM), each versus output power.

DETAILED DESCRIPTION

Figure 1:
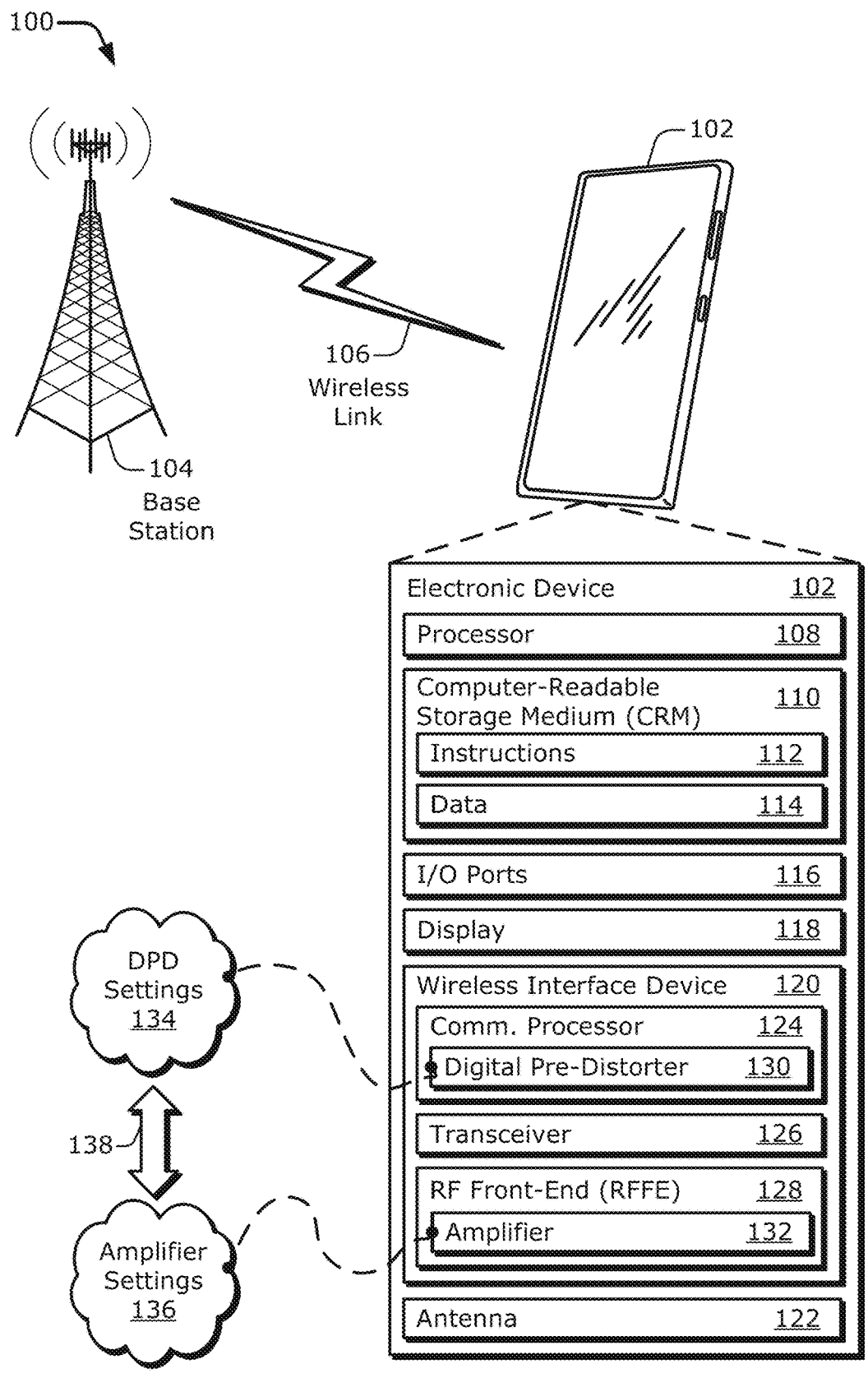
FIG. 1 illustrates an environment with an example electronic device having a wireless interface device that includes a communication processor and a radio-frequency (RF) front-end.

To provide mobile and other types of services in a wireless environment, electronic devices can use a wireless interface device to communicate wireless signals via an antenna. The wireless interface device can include, for example, a communication processor, a wireless transceiver, and a radio-frequency (RF) front-end, which interfaces with the antenna. To provide wireless services, especially newer ones that demand higher bandwidth and lower latency, the components of the wireless interface device are expected to operate efficiently at higher frequencies, with lower power, and/or in rugged applications.

Some aspects of the 5th-Generation (5G) cellular standard increase data rates with various strategies, including higher-order modulations like 256 quadrature amplitude modulation (QAM) and orthogonal frequency-division multiple access (OFDMA) techniques. Other wireless standards, such as IEEE 802.11, are also increasing orders of modulation. As compared to lower-ordered modulation signals, these higher-ordered modulation signals lead to operating wireless transmitters with appreciably lower distortion (e.g., with greater linearity) to preserve the signal quality. Ensuring that wireless transmitters are operated in the linear ranges of their components may be achieved by increasing the back-off of their power amplifiers from saturation. This retreat from the saturation region, however, may cause power inefficiencies that increase power consumption.

To increase power efficiency, a digital pre-distorter (DPD) can be employed to precondition a higher-modulation-order waveform before the waveform is sent through a transceiver and RF front-end. Digital pre-distorters can use weighted combinations of relatively simple nonlinear functions, such as polynomials, to preemptively "undo" the distortion that will subsequently occur in the transceiver or other downstream components. With some sequential approaches to designing a wireless interface device, these nonlinear functions (e.g., DPD kernels) and their coefficients can be selected after the wireless interface device, including a "key" nonlinear block—the power amplifier—is designed, fabricated, and configured according to the specifications for the power amplifier. Consequently, the DPD is designed as an add-on to an already-fabricated transceiver and/or power amplifier to reduce the non-linear distortion of the signal to be transmitted. The transceiver and power amplifier settings, which are determined for stand-alone operation with these approaches, are not modified when a DPD is added to the transmit chain. Although these sequential design approaches for DPDs are relatively simple, they fail to take full advantage of DPD capability and may lead to poor power efficiency. The poor power efficiency consumes excess power during transmission and can drain the battery of a mobile device more quickly.

Generally, a wireless interface device of an electronic device can include a communication processor, a transceiver, and an RF front-end. The communication processor can include a DPD and an envelope tracker (ET) or portion thereof. The RF front-end can include an amplifier, including a power amplifier. As part of a transmission operation, the DPD produces from an input signal a pre-distorted signal and provides the pre-distorted signal to the transceiver. The transceiver, after some processing like modulation or filtering, provides the pre-distorted signal to the amplifier of the RF front-end for emanation from an antenna of the electronic device. The envelope tracker produces a tracking envelope (e.g., envelope-tracking or power tracking signal) from the input signal and provides the tracking envelope to the RF front-end. The RF front-end uses the tracking envelope to power and partially control the amplifier during transmissions. Transmission settings can include, for example, ET settings, DPD settings, transceiver settings, and amplifier settings.

In an example approach to determining transmission settings sequentially, ET settings are "pre-set" separately. The amplifier settings of a power amplifier are "optimized" by sweeping bias setting values to maximize the adjacent channel leakage ratio (ACLR) without DPD being engaged (e.g., activated). The amplifier settings may include, for instance, one or more quiescent current bias settings, such as a quiescent collector current of a bipolar junction transistor (BJT) of the power amplifier. The DPD settings are then determined using the amplifier settings that were already ascertained. With this sequential approach, the amplifier settings that are selected for use during transmission operations may be the same for different output powers (unless the gain changes), identical with different signal modulations, and unchanged whether the DPD is active or not.

Due partially to the presence of the power amplifier, the RF front-end consumes an appreciable portion of the power used for transmission operations. Managing this power usage has become more difficult because several wireless standards have adopted higher-order modulations, which enable higher data rates. To utilize the higher-order modulations, however, linearity in the power amplifier becomes more important. To achieve greater linearity, the RF front-end may back away from operating the power amplifier at the highest or saturated power levels. This back-off can accommodate the higher peak-to-average power ratio that occurs with higher-order modulation schemes. In short, a data rate can be increased by employing a higher-order modulation, but the efficiency of the wireless interface device may decrease as the power usage increases. Thus, the higher-order modulations used in 5G cellular networks may create a power-efficiency problem.

To reduce power consumption in the power amplifier of the RF front-end, the wireless interface device can employ envelope tracking. Envelope tracking entails adjusting a supply voltage for the power amplifier based on a tracked envelope of the signal to be transmitted. The envelope tracker can measure an instantaneous power of the signal as the instantaneous power changes over time to track the signal. The ratio of the peak or instantaneous power to the average power is the peak-to-average power ratio that is mentioned above in the context of backing away from saturation in the power amplifier. The RF front-end adjusts the supply voltage for the power amplifier responsive to the tracked envelope. Unfortunately, envelope tracking is not necessarily efficient alone because the envelope tracking circuitry in the RF front-end (e.g., a class G amplifier for an envelope-tracking amplifier) also consumes power. Thus, envelope tracking alone may fail to solve the power efficiency problem.

Further, with 5G communications relative to 4G communications, signal bandwidth has increased 50% on a per-channel basis—from 20 megahertz (MHz) to 30 MHz in some operations (with wider bandwidths being possible in other operations). This increase in channel bandwidth also increases the power usage of the envelope tracking hardware. Accordingly, there are more and faster excursions, as well as bigger excursions, of the instantaneous power level that is being tracked by the envelope-tracking amplifier of the RF front-end. These instantaneous power excursions cause envelope tracking efficiency to be lower for this additional reason. Overall power efficiency of a transmission operation is a function of the product of the power amplifier efficiency and the envelope-tracking amplifier efficiency. Without implementing the techniques described in this document, both the power amplifier efficiency and the envelope tracking efficiency may drop with 5G communications, so the overall power efficiency likewise may decrease.

In contrast with a sequential setting determination approach, this document describes determining transmission settings jointly and using the jointly determined transmission settings to increase power efficiency, lower transition time to achieve certain parameters, and/or provide other benefits. In some cases, the increased efficiency can be obtained without adding components to a wireless interface device. Transmission settings can include DPD settings, ET settings, transceiver settings, amplifier settings, and so forth. Any two or more types of transmission settings can be jointly determined. For instance, DPD settings and amplifier settings may be jointly determined. Alternatively, DPD settings, ET settings, and amplifier settings may be jointly determined. Example DPD settings include coefficient settings and DPD kernel settings. Example amplifier settings include bias settings, such as a quiescent current of a transistor, and power supplied to the amplifier (e.g., a supply voltage level).

In example implementations, the transmission settings can be jointly determined based on power efficiency. For example, the transmission settings can be jointly determined using a discrete optimization procedure that is attempting to increase (e.g., maximize) power-added efficiency (PAE). A joint transmission-setting determination operation may consider at least one constraint, such as output power, error vector magnitude (EVM), ACLR, and/or spectrum emission mask (SEM). The PAE may be maximized based on one or more factors. Such power efficiency factors may include a gain, quiescent current, supply voltage, input signal power, and at least one aspect of an error tracker (e.g., a parameter voltage).

The joint transmission-setting determination operation may be performed at one or more points of a product's life cycle. First, engineers can jointly determine transmission settings during initial design and testing on a per-design basis. The determined settings can be stored in a look-up table (LUT) of a wireless interface device to accelerate their use during transmission operations. Second, a manufacturer can determine the transmission settings as part of a calibration procedure during manufacturing on a per-device basis. Thus, the manufacturer can refine the settings determined by the designer and/or independently create transmission settings. Third, an electronic device can jointly determine the transmission settings as part of a tuning procedure while the device is deployed in the field. For instance, a setting tuner of a communication processor can fine-tune existing transmission settings to account for changes in an operating environment in substantially real-time, such as during mission mode or even while a signal is being processed for transmission.

In example operations, the wireless interface device accesses a LUT that stores the transmission settings. The LUT can store the transmission settings by frequency, output power, signal modulation, a combination thereof, and so forth. At least partially as a result of the joint determination of the transmission settings, the transmission settings can vary with changes to transmission operations, including varying based on output power changes as the gain remains constant or unchanged. For example, one or more of the amplifier settings can vary for two different output powers under a constant gain. For instance, a quiescent current for a driver amplifier may have one value for a first output power and another value at a second output power while a gain is unchanged. As another example, the amplifier settings can be different, depending on whether a DPD is active or not, with other factors (e.g., output power) remaining unchanged. Further, the amplifier settings can vary for two different signal modulations while other factors (e.g., output power and DPD usage) remain unchanged.

Accordingly, a wireless interface device can use varying transmission settings as retrieved from a LUT or other means for storing settings, with the transmission settings having been determined using a joint transmission-setting determination process. By adjusting transmission settings based on the values stored in the LUT or other means for storing settings, the wireless interface device can increase power efficiency, like PAE. The increased power efficiency can reduce power consumption and thus extend battery life. The increased power efficiency can also support use of the higher-order modulations and wider bandwidths of newer wireless standards, such as those of 5G.

FIG. 1 illustrates an environment 100 with an example electronic device 102 having a wireless interface device 120 that includes a communication processor 124 and a radio-frequency front-end 128. The example communication processor 124 includes a digital pre-distorter 130 (DPD 130) with associated DPD settings 134, and the example radio-frequency (RF) front-end 128 includes an amplifier 132 with associated amplifier settings 136. Other example components and techniques of the wireless interface device 120 are described here with reference to FIG. 1 and further below with reference to FIGS. 2, 3-1, 3-2, and 6.

In the example environment 100, the electronic device 102 communicates with a base station 104 through a wireless link 106, which may be realized with one or more wireless signals. In FIG. 1, the example electronic device 102 is depicted as a smartphone. However, the electronic device 102 may be implemented as any suitable computing or other electronic device forming an apparatus. Examples include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a wireless communication signal. Although depicted as a base station tower of a cellular radio network, the base station 104 may represent or be implemented as another device, such as a satellite, terrestrial broadcast tower, access point, peer-to-peer device, mesh network node, another electronic device as described above generally, and so forth. Also, although the communication link is depicted as a wireless link 106, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102, an uplink of other data or control information communicated from the electronic device 102 to the base station 104, or both a downlink and an uplink communication. The wireless link 106 may be implemented using any suitable communication protocol or standard. Examples of such protocols and standards include a 3rd Generation Partnership Project Long-Term Evolution (3GPP LTE) standard, such as a 4th Generation (4G) or a 5th Generation (5G) cellular standard; an IEEE 802.11 standard (e.g., Wi-Fi 6 or WiGig®), such as an 802.11g, ac, ax, ad, aj, or ay standard; an IEEE 802.16 standard (e.g., WiMAX®); a Bluetooth® standard; and so forth. In some implementations, the wireless link 106 may wirelessly provide power instead of or in addition to communication signaling, and the electronic device 102 or the base station 104 may comprise a power source or a power sink.

As shown, the electronic device 102 can include at least one processor 108 (e.g., at least one application processor) and at least one computer-readable storage medium 110 (CRM 110). The processor 108 may include any type of processor, such as a central processing unit (CPU) or a multicore or graphics processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, or other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, camera or other sensor ports, and so forth. The display 118 can be realized as a display screen or a projection that presents one or more graphical images provided by the electronic device 102, such as a user interface associated with an operating system, program, or application. Alternatively or additionally, the display 118 may be implemented as a display port or virtual interface through which graphical content of the electronic device 102 is communicated or presented.

The electronic device 102 can further include at least one wireless interface device 120 and at least one antenna 122, which are coupled one to another. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with a cellular network via the base station 104 using the wireless interface device 120. However, the electronic device 102 may also or instead communicate directly with peer devices, an alternative wireless network, and the like using the wireless interface device 120.

As shown, the wireless interface device 120 can include at least one communication processor 124, at least one transceiver 126, and at least one radio-frequency front-end 128 (RFFE 128). The communication processor 124 can be coupled to the transceiver 126, and the transceiver 126 can be coupled to the RF front-end 128, which is coupled to the antenna 122. The communication processor 124 can also be "directly" coupled to the RF front-end 128. These components process data information, control information, and signals associated with communicating information for the electronic device 102 via the antenna 122.

The communication processor 124 may be implemented as part of a system-on-chip (SoC), as a modem baseband processor, or as a baseband radio processor (BBP), for example, that realizes a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques, including those that are described herein.

In some cases, the processor 108 and the communication processor 124 can be combined into one module or integrated circuit (IC), such as an SoC. Regardless, the processor 108 or the communication processor 124 can be operatively coupled to one or more other components, such as the CRM 110 or the display 118. This operative coupling enables control of, or other interaction with, the other components of the electronic device 102 by at least one processor. Additionally, the communication processor 124 may also include a memory (not separately shown), such as a CRM 110, to store data and processor-executable instructions (e.g., code). Further, the processor 108 or the communication processor 124, including a combination thereof, can be realized using digital circuitry that implements logic or functionality that is described herein.

The various components that are illustrated in FIGS. 1-4 and 6, as well as the other drawings, using separate schematic blocks may be manufactured or packaged in different discrete manners. For example, one physical module may include components of the RF front-end 128 and some components of the transceiver 126, and another physical module may combine the communication processor 124 with the remaining components of the transceiver 126. Further, the antenna 122 may be co-packaged with at least some components of the RF front-end 128 and/or the transceiver 126. In other examples, the transceiver 126 is implemented as an integrated circuit coupled to the communication processor 124. In such embodiments, elements of the RF front-end 128 may be implemented as one or more discrete components, chips, and/or modules coupled to the transceiver 126.

The transceiver 126 can include circuitry and logic for filtering, amplification, channelization, and frequency translation. The frequency translation may include an up-conversion or a down-conversion of frequency that is performed in a single conversion operation (e.g., with a direct-conversion architecture) or through multiple conversion operations (e.g., with a superheterodyne architecture) using one or more mixers (not shown). Thus, the transceiver 126 can include filters, switches, amplifiers, mixers, and so forth for routing and conditioning, or otherwise processing, signals that are transmitted or received via the antenna 122. Although not explicitly shown in FIG. 1, the wireless interface device 120 can also include a digital-to-analog converter (DAC) or an analog-to-digital converter (ADC) to convert between analog signals and digital signals. A DAC or an ADC can be implemented as part of the communication processor 124, as part of the transceiver 126, or separately from both of them, such as at a "border" between the two components.

Configurable components of the transceiver 126 may be controlled by the communication processor 124 to implement communications in various modes, with different frequency bands, or to comport with a particular wireless standard. The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., to implement separate transmit and receive chains). The transceiver 126 may also include logic to perform in-phase/quadrature (I/Q) operations, such as synthesis, phase correction, modulation, demodulation, and the like.

Generally, the RF front-end 128 can include one or more filters, switches, amplifiers, or phase shifters for conditioning signals received via the antenna 122 or for conditioning signals to be transmitted via the antenna 122. In some examples the RF front-end 128 includes circuitry (e.g., mixer) for frequency translation (e.g., between an intermediate frequency and a frequency used by the wireless link 106, such as an FR2 or other millimeter-wave or higher frequency). The RF front-end 128 may also include other RF sensors and components, such as a peak detector, power meter, gain control block, antenna tuning circuit, diplexer, balun, and the like. Configurable components of the RF front-end 128, such as a power amplifier or mixer or phase shifter, may be controlled by the communication processor 124 to implement communications in various power modes, with different frequency bands, or using beamforming. The RF front end 128 of the wireless interface device 120 is coupled to the antenna 122. The antenna 122 can be implemented as at least one individual antenna, as at least one antenna array that includes multiple antenna elements, or as at least one antenna element of an antenna array. Thus, as used herein, an "antenna" can refer to an individual antenna, an antenna array, or an antenna element of an antenna array, depending on context.

In example implementations, the communication processor 124 includes at least one digital pre-distorter 130 that is associated with one or more DPD settings 134. The digital pre-distorter 130 can pre-distort a signal based on the DPD settings 134 to produce a pre-distorted signal. The radio-frequency front-end 128 includes at least one amplifier 132 that is associated with one or more amplifier settings 136. The amplifier 132 can amplify a signal, including the pre-distorted signal, based on the amplifier settings 136. These settings can be selected to increase power efficiency. For example, the amplifier settings 136 can be selected to support power-added efficiency (PAE) by jointly ascertaining the DPD settings 134 and the amplifier settings 136 through a joint transmission-setting determination operation 138.

Additional or alternative transmission settings, such as envelope tracking settings or transceiver settings, can be ascertained in combination using the joint transmission-setting determination operation 138 as described herein. Additional aspects of the wireless interface device 120, including with regard to the digital pre-distorter 130 and the amplifier 132, are described below with reference to FIGS. 3, 3-1, and 3-2. Next, however, example implementations for performing a joint transmission-setting determination operation 138 are described.

Figure 2:
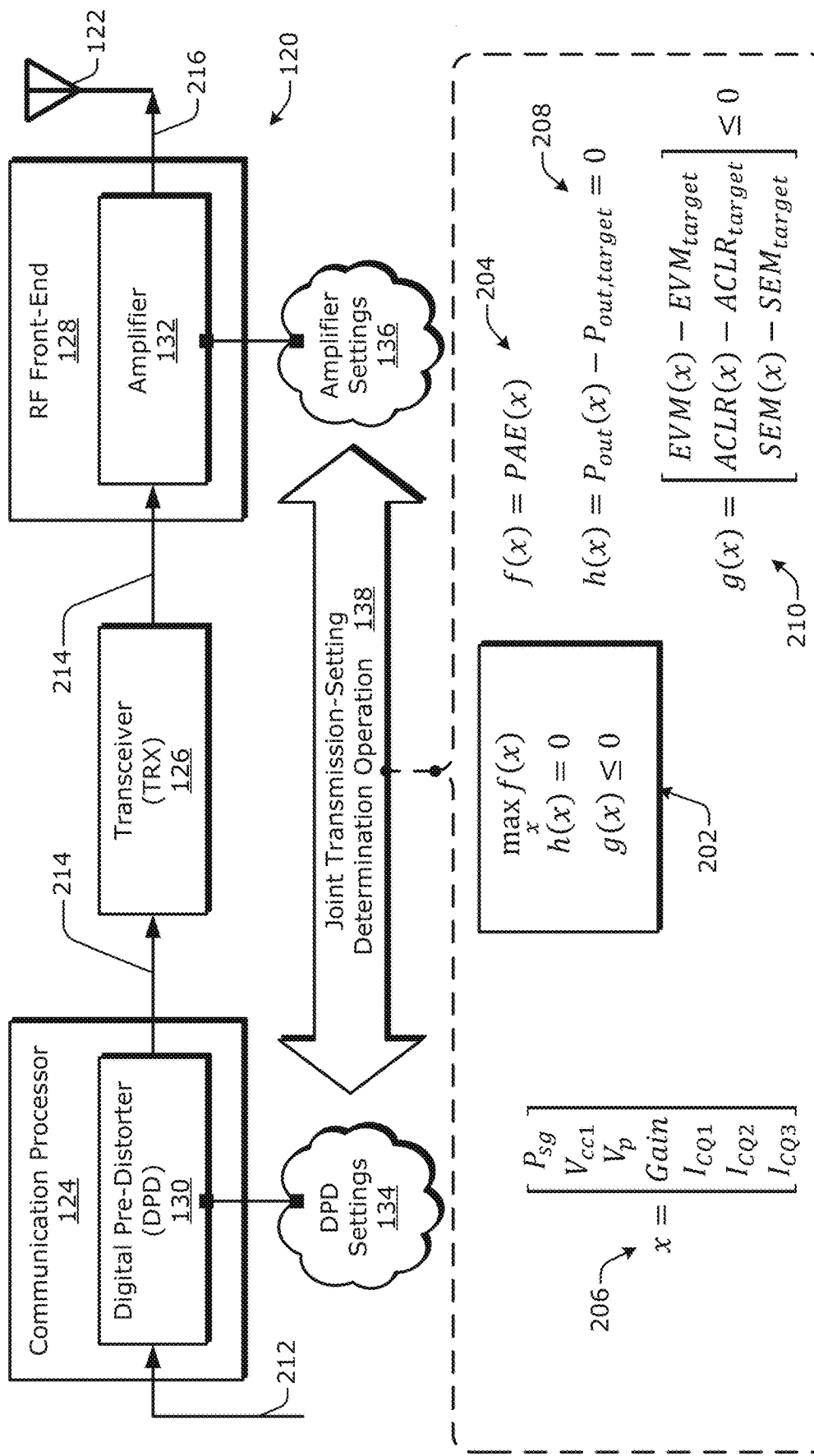
FIG. 2 illustrates an example joint transmission-setting determination operation for at least the transmission settings of the communication processor and the transmission settings of the RF front-end.

FIG. 2 illustrates at 200 generally an example joint transmission-setting determination operation 138 for at least the transmission settings of the communication processor 124 and the transmission settings of the RF front-end 128. In example operations, the digital pre-distorter 130 can pre-distort a signal 212 based on the DPD settings 134 to produce a pre-distorted signal 214. The signal 212 can "originate" within or external to the communication processor 124. The communication processor 124 provides the pre-distorted signal 214 to the transceiver 126. The transceiver 126 accepts the pre-distorted signal 214 from the communication processor 124 and processes the pre-distorted signal 214 in one or more manners. For example, the transceiver 126 can filter, frequency upconvert, modulate, convert from analog to digital, or otherwise process the pre-distorted signal 214.

The transceiver 126 forwards the pre-distorted signal 214 as processed by the transceiver 126 to the RF front-end 128. The RF front-end 128 accepts the pre-distorted signal 214 as processed by the transceiver 126 and couples this signal to the amplifier 132 (and other elements of the RF front-end 128). The amplifier 132 can amplify the pre-distorted signal 214 based on the amplifier settings 136 to produce an output signal 216. The settings of the wireless interface device 120 (e.g., the DPD settings 134 or the amplifier settings 136) can be stored in at least one look-up table (not shown in FIG. 2) for accessing during transmission operations and for fast adjustments to the active or in-use settings. At least the amplifier settings 136 can be selected to increase the power efficiency of the transmission operation using a joint transmission-setting determination operation 138. In some cases, two or more of the DPD settings 134, the amplifier settings 136, envelope tracker settings (not separately identified in FIG. 2), or transceiver settings (not shown in FIG. 2) can be jointly determined.

In example implementations, the joint transmission-setting determination operation 138 can perform an optimization analysis, such as a discrete optimization. The analysis can be performed based on an example optimization framework 202. The optimization framework 202 can include an example objective function, such as a maximization of some relationship among various factors (e.g., $$\max_x f(x)),$$

for the system and one or more example constraints (e.g., $h(x)$ and $g(x)$). A power efficiency characteristic 204 is shown; the power efficiency characteristic 204 can be based on, for instance, power-added efficiency (PAE). The joint transmission-setting determination operation 138 can pertain to one or more of multiple factors 206. Examples of the multiple factors 206 include an input signal power ($P_{sg}$), a supply voltage ($V_{CC1}$), a parameter voltage ($V_p$), a gain (Gain), a quiescent current ($I_Q$, such as $I_{CQ1}$, $I_{CQ2}$, and $I_{CQ3}$), and so forth. Although particular examples of the multiple factors 206 are described herein (and depicted in the drawings), the multiple factors 206 can include more, fewer, and/or different factors relating to transmitting a signal.

As part of the example optimization framework 202, the factors 206 can be varied to maximize the power-added efficiency. While varying these factors 206 to look for a combination that maximizes PAE, the optimization process adheres to the example constraint(s). A first example constraint 208 relates to output power. For example, output power ($P_{out}(x)$) from the amplifier 132 can be constrained to meet a targeted output power ($P_{out,target}$). A second example constraint 210 relates to at least one output quality metric. Examples of output quality metrics include error vector magnitude (EVM(x)), adjacent channel leakage ratio (ACLR(x)), and spectrum emission mask (SEM(x)). For each output quality metric measure, the optimization process can be constrained by ensuring that a produced or measured value is less than or equal to a respective/corresponding target value. For instance, with regard to EVM, an example constraint is $[EVM(x)-EVM_{target}] \leq 0$. With regard to ACLR, an example constraint is $[ACLR(x)-ACLR_{target}] \leq 0$. And with regard to SEM, an example constraint is $[SEM(x)-SEM_{target}] \leq 0$. This document now further describes the example factors 206 with reference to a schematic diagram of a wireless interface device 120 that is depicted in FIG. 3.

Figures 1, 3:
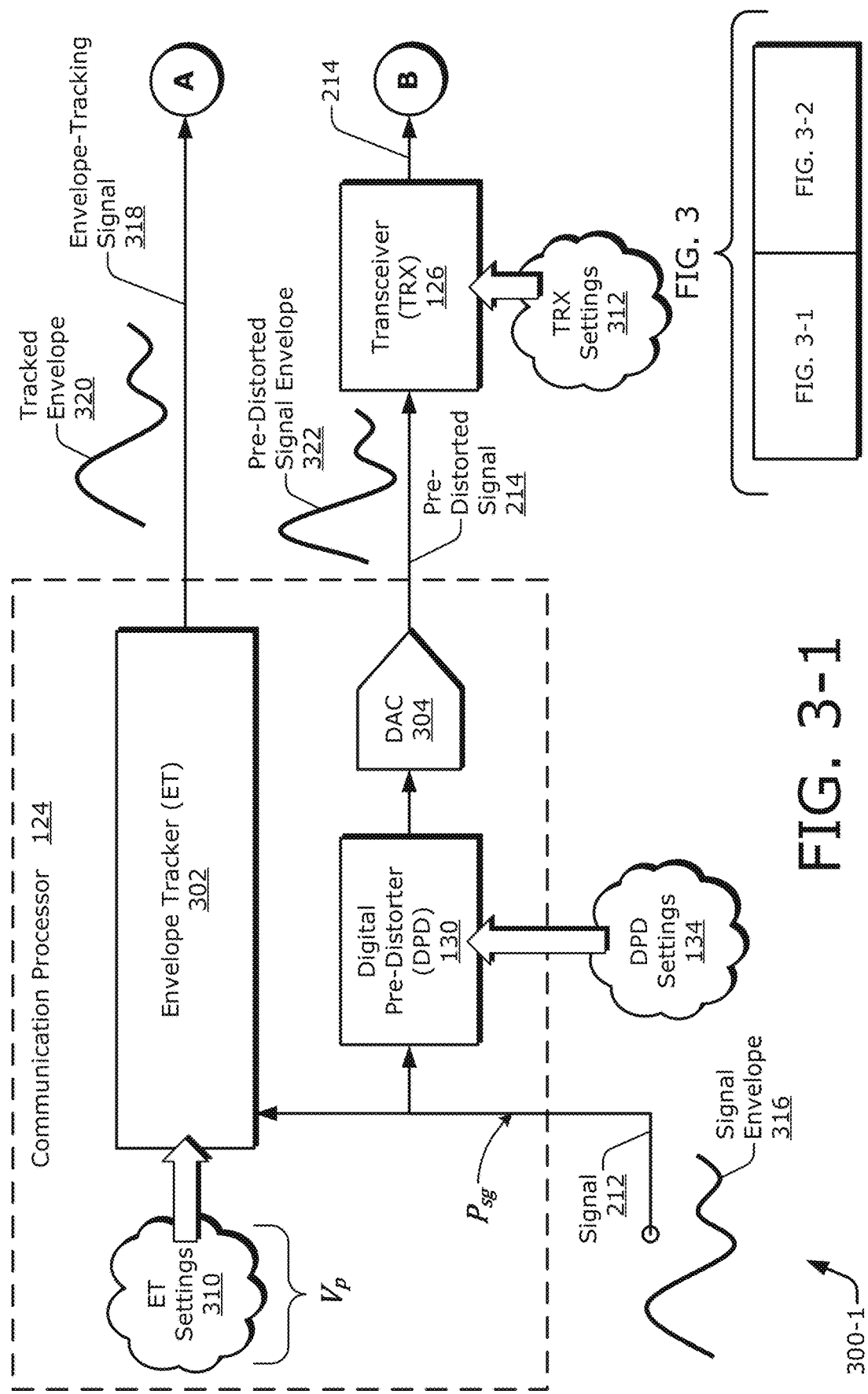
FIG. 3 is a schematic diagram illustrating a wireless interface device across FIG. 3-1, which depicts an example communication processor and a transceiver, and FIG. 3-2, which depicts an example RF front-end.
Figures 2, 3:
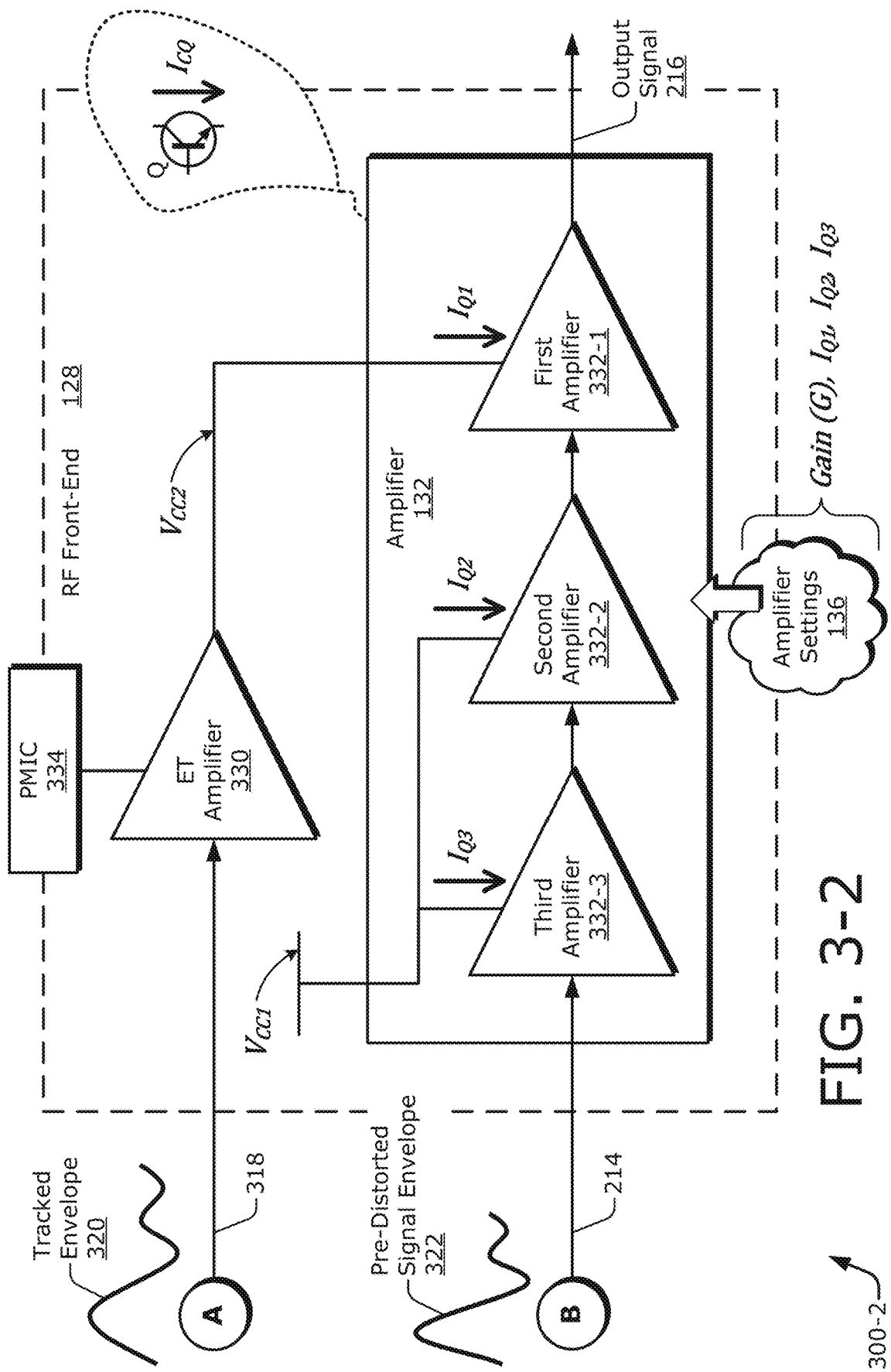

FIG. 3 is a schematic diagram illustrating an example wireless interface device 120 (e.g., of FIGS. 1 and 2) that is distributed across two drawing sheets: FIGS. 3-1 and 3-2. As indicated in the lower right corner of FIG. 3-1, FIG. 3-1 depicts a "left" portion of the wireless interface device 120, and FIG. 3-2 depicts a "right" portion of the wireless interface device 120. More specifically, FIG. 3-1 illustrates at 300-1 an example communication processor 124 and a transceiver 126. FIG. 3-2 illustrates at 300-2 generally an example RF front-end 128 that is coupled to the communication processor 124 and the transceiver 126 as indicated by the encircled "A" and "B."

In example implementations, the communication processor 124 includes at least one envelope tracker 302 (ET 302) and at least one DAC 304 in addition to the digital pre-distorter 130. In other examples, the DAC 304 is disposed in the transceiver 126, and an output of the digital pre-distorter 130 is provided from the communication processor 124 to the transceiver 126 digitally. The envelope tracker 302 is associated with one or more ET settings 310. Examples of the ET settings 310 include one or more parameter voltages and at least one control parameter, which may be provided as an input to or at last partially control selection of an ET function that converts from the envelope voltage to a supply voltage. The parameter voltage ($V_p$) can include, for example, a first voltage and a second voltage (e.g., at least one voltage level or one or more different threshold voltages). The parameter voltage ($V_p$) can correspond to at least one of the example power efficiency factors 206 of FIG. 2.

Continuing with FIG. 3-1, the transceiver 126 (TRX 126) is associated with one or more transceiver settings 312 (TRX settings 312). Examples of the TRX settings 312 include one or more bias settings for at least one driver amplifier. As indicated by the encircled "A," an output of the envelope tracker 302 is forwarded to a component in FIG. 3-2. As indicated by the encircled "B," an output of the transceiver 126 is also forwarded to a component in FIG. 3-2.

Transitioning to FIG. 3-2, in addition to the amplifier 132, the RF front-end 128 can include at least one amplifier 330 (e.g., an envelope tracking amplifier 330). The amplifier 132 can include multiple amplifying stages or multiple amplifiers. As shown, the amplifier 132 in the illustrated example includes three amplifiers: a first amplifier 332-1, a second amplifier 332-2, and a third amplifier 332-2. The amplifier 132 may, however, have more or fewer than three amplifiers. In some cases, the first amplifier 332-1 may correspond to a power amplifier, the second amplifier 332-2 may correspond to a driver amplifier, and the third amplifier 332-3 may correspond to a preliminary driver amplifier.

As indicated by the encircled "A," the ET amplifier 330 is coupled to the envelope tracker 302 and can receive an output of the envelope tracker 302 of FIG. 3-1. As indicated by the encircled "B," the amplifier 132 (e.g., the third amplifier 332-3) is coupled to the transceiver 126 and can receive an output of the transceiver 126 of FIG. 3-1. As shown near the "top" of FIG. 3-2, the RF front-end 128 can include or otherwise have access to a power management integrated circuit 334 (PMIC 334). The PMIC 334 can provide power to the ET amplifier 330 from a power source (not shown), such as a power rail, battery, or voltage regulator.

In example operations, the amplifier 330 (or ET amplifier 330) can provide a supply voltage to the amplifier 132, such as to the first amplifier 332-1. This ET-related supply voltage is indicated by "$V_{CC2}$" in FIG. 3-2. The RF front-end 128 can also provide a supply voltage to one or more other amplifiers (e.g., the second and third amplifiers 332-2 and 332-3), such as with a voltage rail having an adjustable supply voltage and/or using the PMIC 334. This adjustable supply voltage is indicated by "$V_{CC1}$" in FIG. 3-2. The supply voltage ($V_{CC1}$) that powers at least part of the amplifier 132 and that is adjustable can correspond to one of the example power efficiency factors 206 of FIG. 2. In some examples, a power supply of one or more of the driver amplifiers also tracks a signal envelope, for example using the amplifier 330 and/or another ET amplifier.

Examples of the amplifier settings 136 include at least one gain and at least one quiescent current. The gain (G) of the amplifier 132 can refer to, for instance, the power output by the amplifier 132 or how the power (or just voltage or current) output by the amplifier 132 relates to the power (or just voltage or current) input to the amplifier 132. The gain can be established by, for example, selecting an attenuation level, selecting a quantity of active or switched-in amplifiers, and so forth to establish a given output decibel level. Each respective quiescent current ($I_Q$) can correspond to a respective amplifier 332. Thus, a first quiescent current ($I_{Q1}$) can correspond to the first amplifier 332-1 (e.g., a first transistor thereof), and a second quiescent current ($I_{Q2}$) can correspond to the second amplifier 332-2 (e.g., a second transistor thereof). Further, a third quiescent current ($I_{Q3}$) can correspond to the third amplifier 332-3 (e.g., a third transistor thereof). Although particular examples of the amplifier settings 136 are described herein (and depicted in the drawings), the amplifier settings 136 can include more, fewer, and/or different settings related to the amplifier 132.

Each quiescent current can represent, for instance, a quiescent bias current established in at least one transistor of a respective or corresponding transistor. This is depicted with respect to an NPN bipolar junction transistor (BJT) having a bias setting with a quiescent collector current ($I_{CQ}$). Other transistor types, however, can be used instead of, or in addition to, an NPN BJT. Other transistor types include PNP BJTs, field-effect transistors (FETs) (n-type or p-type), insulated-gate bipolar transistors (IGBTs), and so forth. The gain (Gain (G)) and the one or more quiescent currents ($I_{Q1}$, $I_{Q2}$, and $I_{Q3}$) can correspond to four of the example power efficiency factors 206 of FIG. 2.

With reference to both FIGS. 3-1 and 3-2, as part of a transmission operation for the signal 212, the wireless interface device 120 routes the signal 212 to the digital pre-distorter 130 and the envelope tracker 302. The signal 212 has a signal envelope 316 and a signal power. The signal power ($P_{sg}$) that is associated with the signal 212 (or input signal 212), which signal is input to the transmit chain, can correspond to one of the example power efficiency factors 206 of FIG. 2. The envelope tracker 302 can map the signal envelope 316 to an envelope-tracking envelope to produce an envelope-tracking signal 318 having a tracked envelope 320 based on the one or more ET settings 310.

The envelope tracker 302 forwards the envelope-tracking signal 318, which may be in analog form (or in digital form and converted to analogy in the RF front-end 128), to the RF front-end 128, as indicated by the encircled "A." In FIG. 3-2, the RF front-end 128 accepts the envelope-tracking signal 318 that is indicative of the tracked envelope 320 at the ET amplifier 330. Thus, the ET amplifier 330 can produce the supply voltage $V_{CC2}$ based on the tracked envelope 320 of the envelope-tracking signal 318. The ET amplifier 330 can be realized using any of multiple types of amplifiers, such as a class G amplifier, or a combination of several amplifiers, such as a liner amplifier coupled to a switcher. The ET amplifier 330 provides the supply voltage $V_{CC2}$ to the amplifier 132, such as to the first amplifier 332-1.

Returning to FIG. 3-1, the digital pre-distorter 130 receives the signal 212. The digital pre-distorter 130 produces the pre-distorted signal 214 from the input signal 212 based on the DPD settings 134. The DPD settings 134 may include one or more DPD coefficients. Additionally or alternatively, the DPD settings 134 can include an identification of one or more functions (e.g., non-linear functions such as polynomials) to which the DPD coefficients are applied. These functions are also referred to as DPD kernels. The pre-distorted signal 214 is generated to preemptively counteract the non-linear effects of downstream components, such as the amplifier 132.

The pre-distorted signal 214 has a pre-distorted signal envelope 322 as compared to the signal envelope 316 of the signal 212. The pre-distorted signal 214 may also have a different bandwidth than the signal 212. In some cases, the pre-distorted signal 214 has a bandwidth that is greater than—such as 3-5 times greater than—the bandwidth of the signal 212. For example, if the signal 212 has a 20 MHz bandwidth, the bandwidth of the pre-distorted signal 214 may be 60-100 MHz.

The DAC 304 can convert a digital version of the pre-distorted signal 214 to an analog version of the pre-distorted signal 214. In alternative implementations, the DAC 304 (and/or other DAC components) may be separate from the communication processor 124—e.g., may be part of the RF front-end 128 or the transceiver 126. If not, the transceiver 126 can receive an analog version of the pre-distorted signal 214. The transceiver (TRX) 126 processes the pre-distorted signal 214 based on one or more TRX settings 312. The transceiver 126 forwards the processed pre-distorted signal 214, having the pre-distorted signal envelope 322, to the RF front-end 128 of FIG. 3-2 as indicated by the encircled "B."

Continuing with FIG. 3-2, the amplifier 132 can accept the pre-distorted signal 214 with the pre-distorted signal envelope 322 from the digital pre-distorter 130 via the transceiver 126. The amplifier 132 amplifies the pre-distorted signal 214 based on the one or more amplifier settings 136 to produce the output signal 216. The amplifier 132 may include multiple stages, such as the three stages as shown. The first amplifier 332-1 is partially controlled based on the power that is supplied thereto as the supply voltage $V_{CC2}$, which is responsive to the tracked envelope 320 of the envelope-tracking signal 318.

In contrast, the other stage(s) may be supplied power separately from the ET-based supply voltage. As shown, the second and third amplifiers 332-2 and 332-3 can be powered by the supply voltage $V_{CC1}$. This supply voltage $V_{CC1}$ can be adjusted during operation to increase power efficiency. Accordingly, the supply voltage $V_{CC1}$ can be included in an optimization analysis for a joint transmission-setting determination operation 138, which is described further below with reference to FIG. 4. The amplifier 132 can be biased with at least one amplifier bias setting of the one or more amplifier settings 136. An example of an amplifier bias setting is a quiescent current, such as a collector current $I_{CQ}$ of the BJT transistor Q. As shown, each respective amplifier 332 of the multiple amplifiers 332-1, 332-2, and 332-3 can be biased with a respective current $I_Q$ of the multiple bias currents $I_{Q1}$, $I_{Q2}$, and $I_{Q3}$. These multiple bias currents $I_{Q1}$, $I_{Q2}$, and $I_{Q3}$ can also be included in an optimization analysis for a joint transmission-setting determination operation 138. Another example of an amplifier bias setting is a supply voltage applied to the amplifier.

Figure 4:
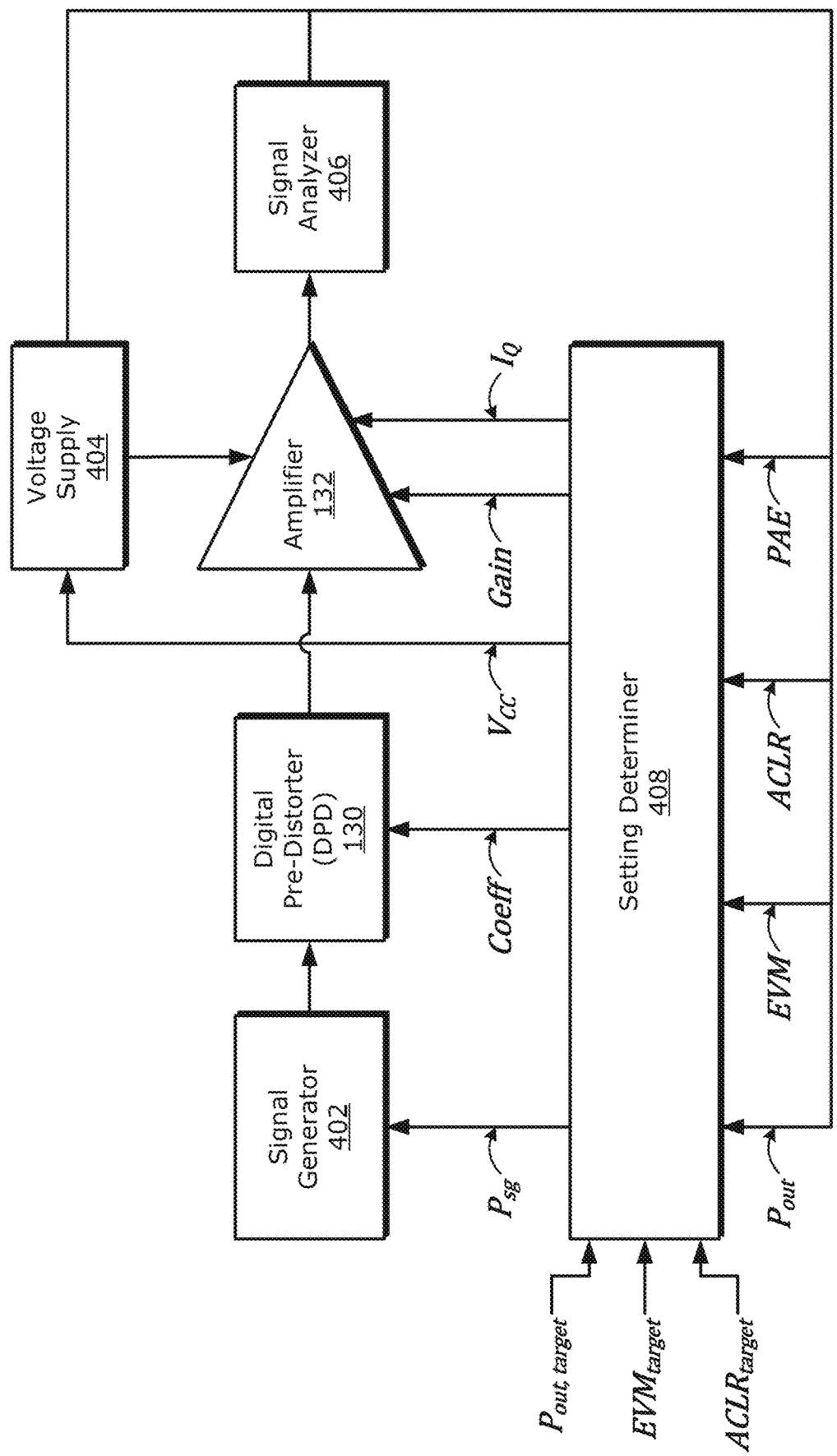
FIG. 4 is a schematic diagram illustrating example hardware to perform a joint transmission-setting determination operation.

FIG. 4 is a schematic diagram 400 illustrating example hardware to perform a joint transmission-setting determination operation 138 (e.g., of FIG. 2). In example implementations, the hardware can include, in addition to a digital pre-distorter 130 and an amplifier 132, a signal generator 402, a voltage supply 404, a signal analyzer 406, and a setting determiner 408. In this example, the setting determiner 408 is determining input power ($P_{sg}$), DPD coefficients (Coeff), a supply voltage ($V_{CC}$), a gain (Gain), and at least one quiescent current ($I_Q$), but different and/or more or less settings may be determined instead.

The setting determiner 408 determines these settings based on values of metrics resulting from performing or partially simulating a transmission operation. These values can include output power (Pout), error vector magnitude (EVM), adjacent channel leakage ratio (ACLR), and power-added efficiency (PAE). A discrete optimization procedure is attempting to maximize the PAE while meeting constraints on the three metrics that have corresponding targeted values: targeted output power ($P_{out,target}$), targeted EVM ($EVM_{target}$), and targeted ACLR ($ACLR_{target}$). The setting determiner 408 provides the input power ($P_{sg}$) to the signal generator 402, the one or more coefficients (Coeff) to the digital pre-distorter 130, the supply voltage ($V_{CC}$) to the voltage supply 404, and the gain (Gain) and quiescent current ($I_Q$) to the amplifier 132 to control the operation and/or the settings of these four components.

In example operations, the signal generator 402 generates an input signal (like the signal 212 of FIG. 3-1) at the designated input power ($P_{sg}$) and provides the input signal to the digital pre-distorter 130. The digital pre-distorter 130 distorts the input signal to produce a pre-distorted signal (like the pre-distorted signal 214 of FIGS. 3-1 and 3-2) based on the DPD coefficients (Coeff). The voltage supply 404 powers the amplifier 132 based on the indicated supply voltage ($V_{CC}$). By amplifying the pre-distorted signal based on the gain (Gain) and at least one quiescent current ($I_Q$), as well as the supply voltage ($V_{CC}$), the amplifier 132 produces an output signal (like the output signal 216 of FIG. 3-2) for the signal analyzer 406. The signal analyzer 406 can produce values for the four resulting metrics that are being maximized or constrained based at least partially on the output signal from the amplifier 132. The factors being optimized can be changed iteratively each round based on the performance metrics provided to the setting determiner 408.

A discrete optimization procedure may be performed differently from that of FIG. 4. For example, envelope tracking can be added to the hardware. To do so, the setting determiner 408 also computes one or more ET settings 310 (of FIG. 3-1). Such ET settings 310 can be provided to an envelope tracker 302. The envelope tracker 302 then causes at least one supply voltage to be provided to the amplifier 132 based on a tracked envelope 320 (e.g., causes a supply voltage $V_{CC2}$ to be applied to a first amplifier 132-1). Additionally or alternatively, a discrete optimization procedure may consider another characteristic to maximize (or minimize) instead of or besides PAE, or the procedure may use a different set of constraints (e.g., may include SEM and/or omit EVM).

If five to ten variables corresponding to, e.g., the seven example power efficiency factors 206 (of FIG. 2) were swept at just a single output power level, a determination process could take decades. In contrast, by employing a discrete optimization process instead, the seven example factors 206 may be determined for 10 output power levels in less than a day. With discrete optimization, multiple settings—such as amplifier, DPD, and ET settings—can be jointly optimized for maximum PAE at each output power. At least a portion of these multiple settings can also or instead be jointly optimized for each signal modulation and/or for whether DPD is active. Further, at least some of these settings may be optimized for different resource block (RB) allocations. The settings can be optimized while meeting target values for one or more performance metrics like EVM, ACLR, SEM, and so forth. Although particular examples of settings being optimized, values being targeted, and metrics being analyzed are described herein (and depicted in the drawings, such as in FIG. 4), these settings, values, and metrics can include more, fewer, and/or different ones. For example, PAE may be a selected key performance indicator (KPI), and an optimization process may include one or more ET settings. As another example, ACLR may be excluded from one optimization process, and/or multiple supply voltages may be considered.

Different constrained optimization algorithms may be employed to perform a joint transmission-setting determination operation 138. Two example classifications are derivative-free and derivative-based. Derivative-free constrained optimization algorithms include simplex and genetic algorithms. Derivative-based constrained optimization algorithms include first-order ones (e.g., gradient descent) and second-order ones (e.g., Newton and quasi-Newton). The first-order algorithms can generally be performed on simpler hardware, more quickly, and/or with less power. These include conjugate gradient, fast gradient, and alternating direction method of multipliers (ADMM) algorithms. The first-order ones, however, may not locate a global maximum or minimum.

The second-order derivative-based algorithms, on the other hand, can determine the global minimum or maximum. These include sequential quadratic programming (SQP)/active set, interior point, and augmented Lagrangian algorithms. The second-order algorithms, however, generally consume more power, involve longer processing times, and/or rely on more complex processing hardware. Nonetheless, the second-order algorithms can be used in various types of electronic devices by, in part, prepopulating at least part of a look-up table (LUT) during design or manufacturing. This is described below with reference to FIGS. 5 and 6.

Other constrained optimization algorithms may be used in place of those presented above. Alternative techniques and/or determination approaches may also be employed, such as a neural network-based or other artificial intelligence (AI)-based approach. Further, continuous and discrete settings may also be optimized (e.g., using mixed-integer optimization).

Figure 5:
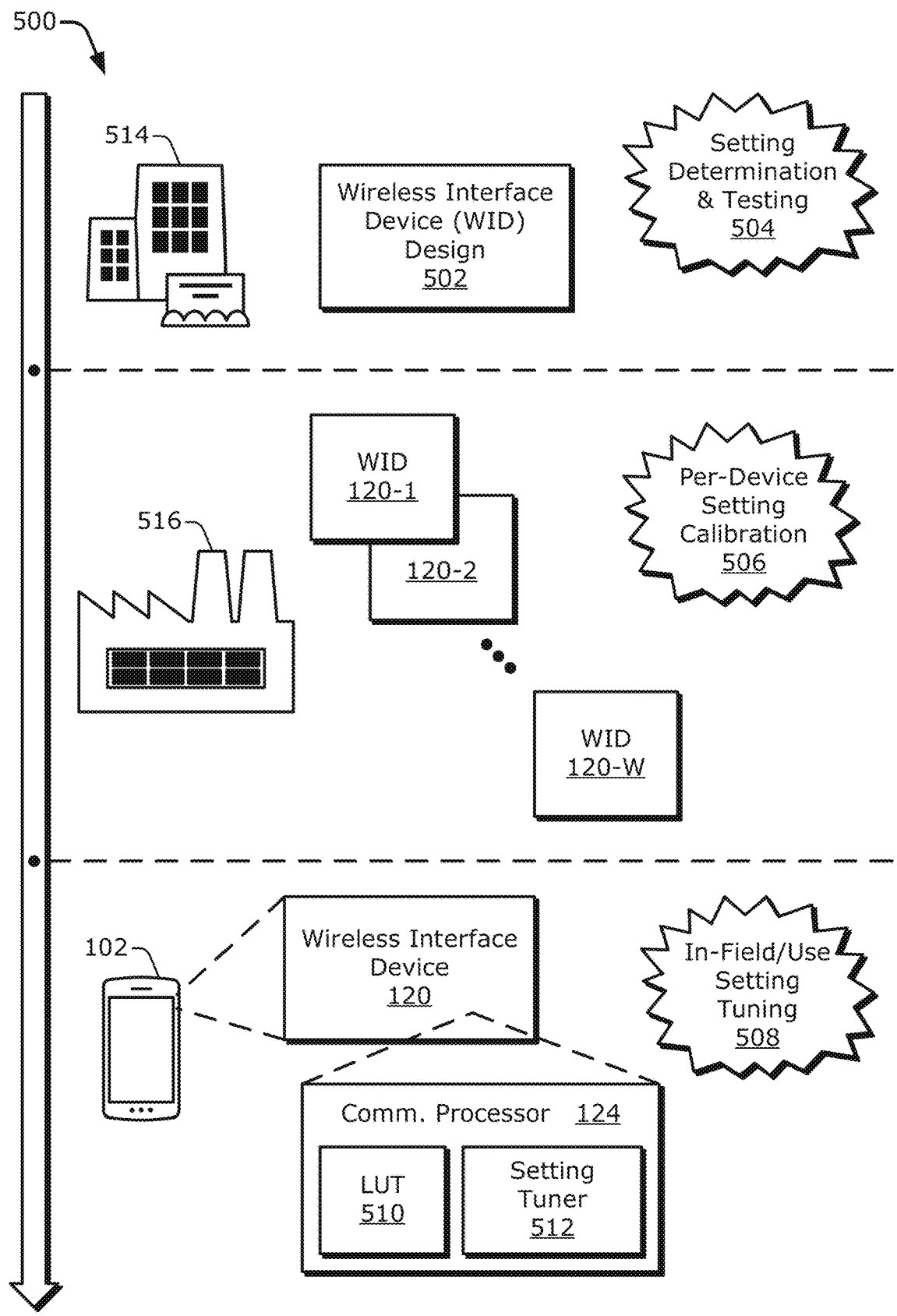
FIG. 5 illustrates multiple example environments for performing a joint transmission-setting determination operation.

FIG. 5 illustrates at 500 generally multiple example environments or scenarios for performing a joint transmission-setting determination operation 138 (e.g., of FIGS. 1 and 2). As described above, the joint transmission-setting determination operation 138 can entail jointly optimizing multiple different settings, such as amplifier settings, ET settings, and DPD settings. The multiple different transmission settings can be optimized per each power level and/or modulation to reduce the power consumed in a power amplifier of a transmit chain. Additional or alternative optimized transmission settings can include TRX settings and other modem settings besides ET and DPD settings. Three example environments/scenarios are described with reference to FIG. 5: a per-design scenario in a design and testing environment, a per-device or per-batch scenario in a manufacturing environment, and a per-tuning or real-time scenario in a field-use environment.

Initially, for a wireless interface device (WID) design 502, a designer 514 can determine (e.g., optimize) transmission settings in a lab over several parts for different power levels and modulations. At 504, a single set of settings may be selected for a first version or generation of parts across different power levels and modulations, and thus the joint transmission-setting determination operation 138 may be performed in a device other than the electronic device 102. These settings can be stored on an electronic device 102 in a look-up table 510 (LUT 510) as new or initial transmission settings based on the determination by the other device.

At 506, a manufacturer 516 can calibrate transmission settings on a per-device or a per-batch basis. During factory testing of a part (e.g., a wireless interface device 120) or an electronic device 102, the determined transmission settings can be calibrated to account for part-to-part variations across multiple wireless interface devices 120-1, 120-2, . . . , 120-W, with "W" corresponding to an integer that represents a quantity in a batch. In such scenario, the joint transmission-setting determination operation 138 may be performed in a device other than the electronic device 102, in the electronic device 102, or partially in the electronic device 102 and partially in the other device. These calibrated versions of the transmission settings can be stored in the LUT 510 as new/additional settings or as updated/replacement settings.

At 508, an electronic device 102 of a user can fine tune the transmission settings that are stored in the look-up table (LUT) 510, which may be part of a communication processor 124, as shown, or part of the CRM 110, or the electronic device 102 can generate initial settings to store in the LUT 510. The fine-tuning can be performed in real-time, such as when the electronic device 102 is in the field and/or while the user is operating the device. A setting tuner 512 of the communication processor 124 can employ, for instance, a relatively faster optimization algorithm (e.g., one based on a gradient descent algorithm or another first-order technique) in the tuning operation. Alternatively, at least a portion of the setting tuner 512 may be part of, and executing on, an application processor of the electronic device 102.

The setting tuner 512 can perform the fine-tuning 508 during boot-up or initialization of the wireless interface device 120, periodically, responsive to changing operating conditions, when a transmitter is not in use, and so forth. Generally, a feedback receiver in the transceiver can sample the output signal of the power amplifier and down-convert the sampled signal to baseband for the modem. The modem can measure or compute EVM, ACLR, and other metrics used in the determination analysis. Hardware examples for the scenario 508 are described next with reference to FIG. 6.

Figure 6:
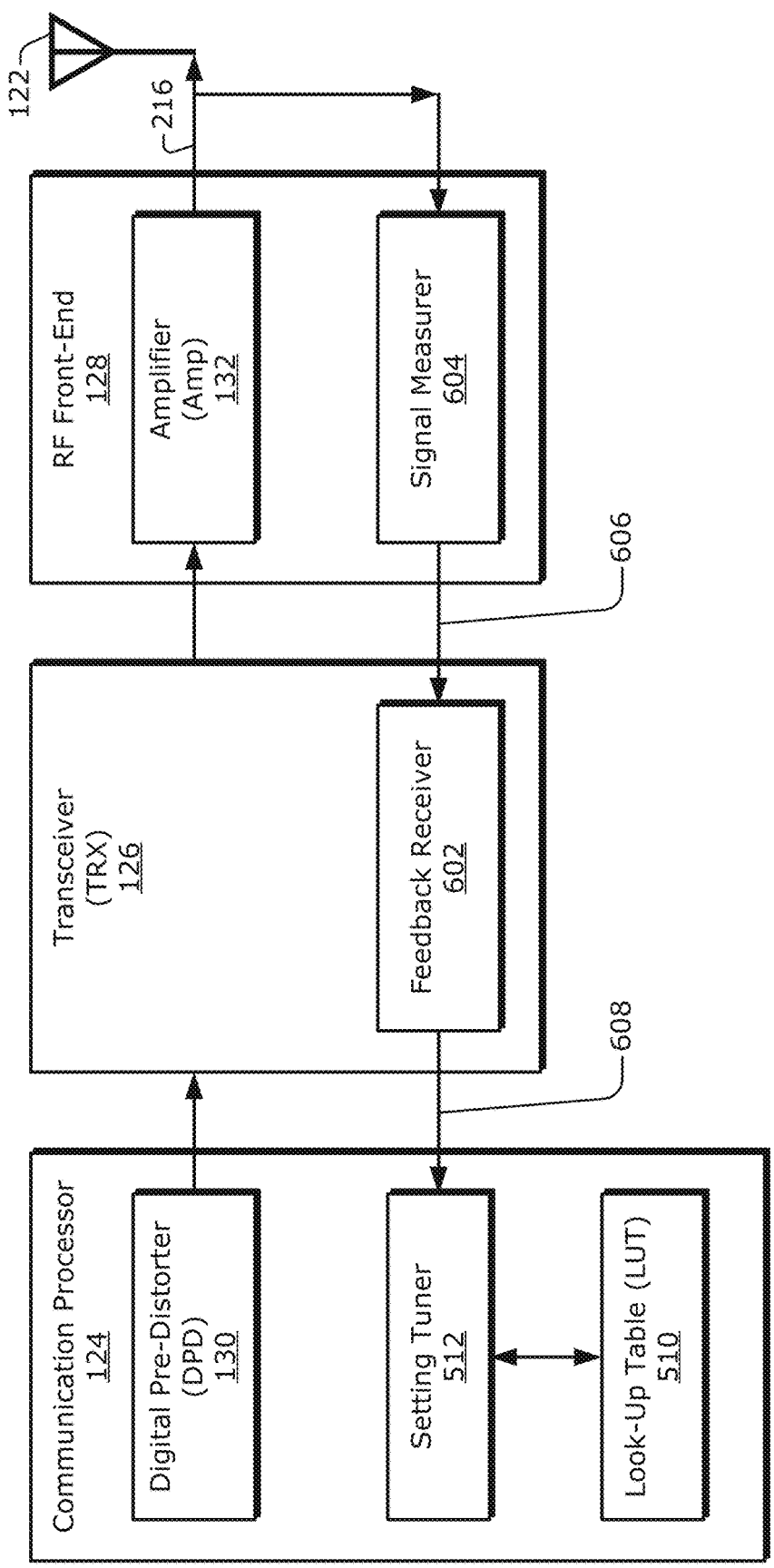
FIG. 6 is a schematic diagram illustrating example hardware to perform a joint transmission-setting determination operation with an electronic device after deployment.

FIG. 6 is a schematic diagram 600 illustrating example hardware to perform a joint transmission-setting determination operation 138 with an electronic device 102 (e.g., of FIG. 1) after deployment, including with a mobile or battery-powered electronic device. As shown, the transceiver 126 can include a feedback receiver 602, and the RF front-end 128 can include a signal measurer 604. The communication processor 124 can include the setting tuner 512 and the LUT 510. Alternatively, all or a portion of the setting tuner 512 may be implemented on another processor. For example, at least part of the code for the discrete optimization algorithm may execute on another processor 108, such as an application processor with additional, different, or more-powerful computing resources.

In example implementations, the signal measurer 604 can be implemented as a signal coupler, a switch, and so forth. The signal measurer 604 senses the output signal 216 and provides an indication 606 of the output signal 216 to the feedback receiver 602 of the transceiver 126. The feedback receiver 602 down-converts the frequency of the indication signal 606 from an RF or an intermediate frequency (IF) to a baseband frequency (BBF) signal and provides at least one signal 608 to the communication processor 124. An ADC (not shown) of the transceiver 126 or the communication processor 124 can also convert the signal 608 from an analog version to a digital version.

The setting tuner 512 accepts the digital version of the BBF signal 608. Based on this BBF signal 608, which is derived from the output signal 216, the setting tuner 512 can analyze the output signal 216. Thus, the setting tuner 512 can perform the functions of the signal analyzer 406 (of FIG. 4). The setting tuner 512 can also perform functions of the setting determiner 408. A signal generator, like the signal generator 402 (of FIG. 4), can be part of the communication processor 124 to produce an input signal 212 (e.g., of FIGS. 2 and 3-1) for the digital pre-distorter 130 and an envelope tracker 302 (not shown in FIG. 6). Due to power, time, or processing capability limitations, the setting tuner 512 may implement a relatively simpler optimization algorithm, such as a first-order gradient algorithm. As the setting tuner 512 determines new or updated transmission setting values, the setting tuner 512 may store these transmission setting values as additions or replacements in the LUT 510. Example implementations of the LUT 510 are described below with reference to FIGS. 7 and 8.

Figures 1, 7:
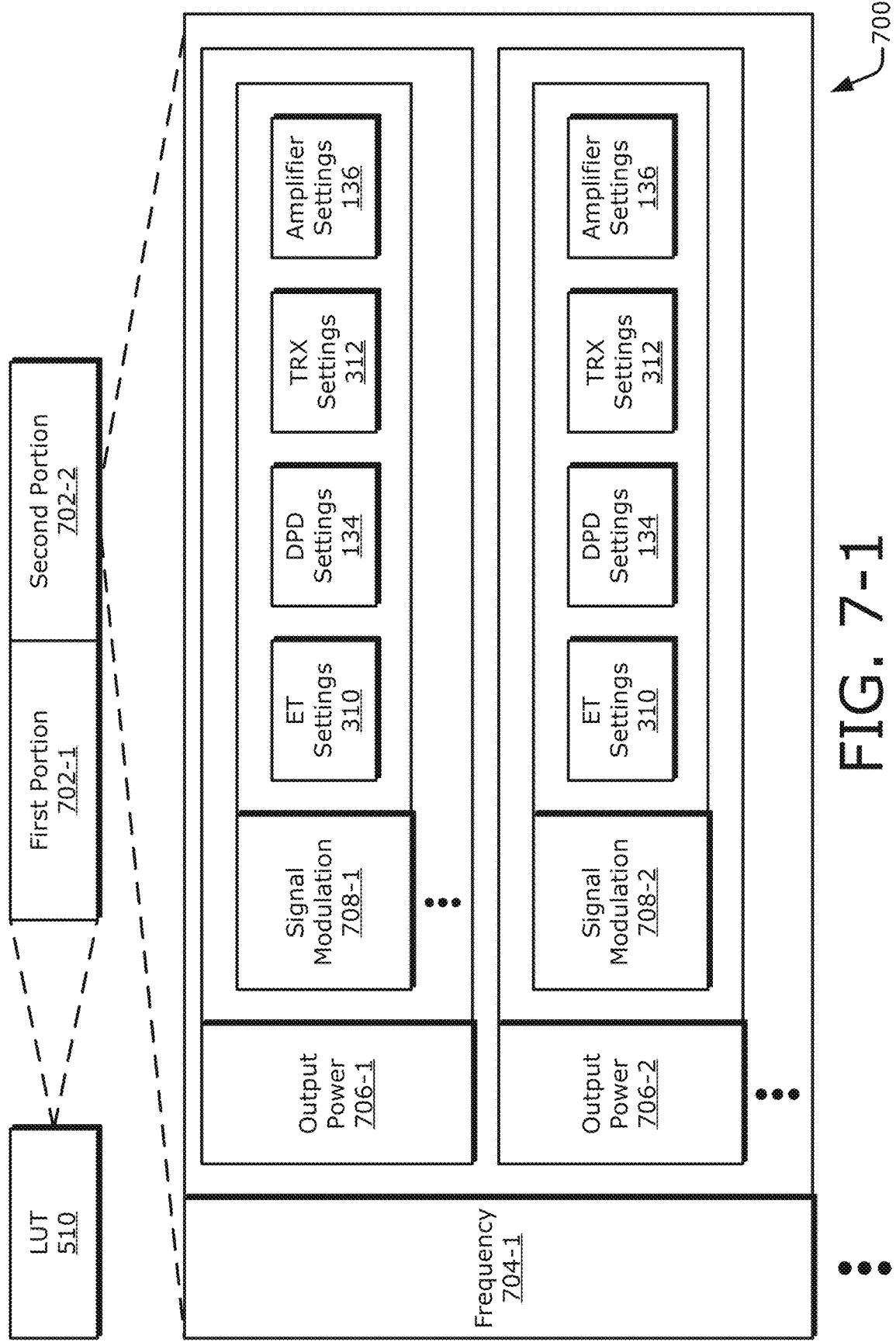
Figures 2, 7:
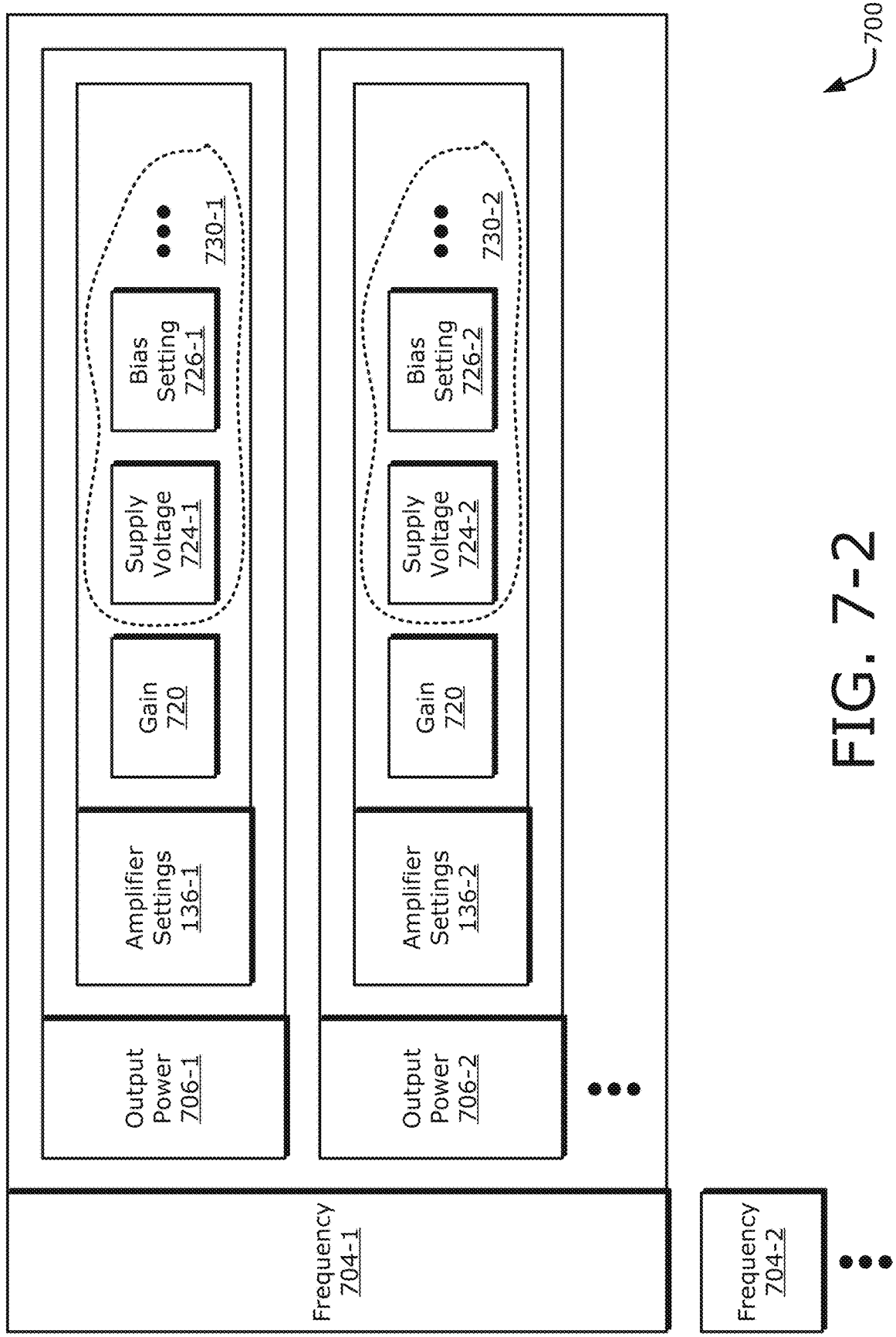

FIGS. 7-1 and 7-2 illustrate example implementations for at least one look-up table (LUT) 510 that can be used to implement transmission setting selection. The LUT 510 can be stored at an electronic device 102, such as by the communication processor 124 in at least one computer-readable medium (CRM). At example table 700-1 of FIG. 7-1, a LUT 510 can include multiple portions: a first portion 702-1 and a second portion 702-2. The LUT 510 may alternatively have a single portion or more than two portions. Each portion 702 includes one or more transmission settings pertaining to particular component(s) of the wireless interface device 120. Further, each portion 702 may correspond to determining some settings jointly and other settings at least partially separately, such as if a component (e.g., a digital pre-distorter 130) may be disengaged (e.g., deactivated by decoupling the component from power or by switching a signal path away from the component) for some transmission operations.

In example implementations, the first portion 702-1 of the LUT 510 can correspond to multiple transmission settings for a radio-frequency front-end 128, such as for any one or more components thereof. The multiple settings (e.g., of an amplifier 132) associated with the RF front-end 128 that are stored in the first portion 702-1 can be determined separately from other settings of the wireless interface device 120. In contrast, the second portion 702-2 can correspond to the multiple settings for the RF front-end 128 in which the multiple settings are determined jointly with the other settings of the wireless interface device 120.

In some cases, the other settings can include one or more DPD settings 134 of a digital pre-distorter 130. Thus, the multiple settings associated with the RF front-end 128 that are stored in the first portion 702-1 can be determined without consideration of the DPD settings 134. These transmission settings are therefore applicable to instances when the digital pre-distorter 130 is disengaged. Because the digital pre-distorter 130 consumes power, it may be more efficient to disengage (e.g., disconnect or turn off) the digital pre-distorter 130 if the transmission operation involves using a lower-order signal modulation, like quadrature phase-shift keying (PSK) (QPSK). The multiple settings associated with the RF front-end 128 that are stored in the second portion 702-2 can be determined while considering (e.g., may be determined jointly with) the DPD settings 134. Thus, the first portion 702-1 may exclude DPD settings 134, and the second portion 702-2 may include DPD settings 134.

Although the multiple settings associated with the RF front-end 128 that are stored in the first portion 702-1 can be determined without considering the DPD settings 134, these multiple settings may still be jointly determined with other settings, such as one or more transceiver settings 312 or other settings of the communication processor 124. The first portion 702-1 and the second portion 702-2 are depicted as separate blocks. The transmission settings of these two portions, however, may be arranged differently "within" the LUT 510. For example, the transmission settings of one portion may be overlaid on, may be interlaced with, or may otherwise be overlapped or intermingled with the transmission settings of the other portion.

As illustrated for some example approaches to tabular organization, the LUT 510 can include multiple frequency entries, such as a first frequency entry 704-1, which is explicitly depicted. Each frequency entry 704 can include other entries that are organized by another parameter and/or setting. As shown, each frequency entry 704 can include multiple output power entries, such as a first output power entry 706-1 and a second output power entry 706-2.

Each output power entry 706 can include or otherwise be associated with (e.g., linked to) additional entries. In FIG. 7-1, each output power entry 706 includes multiple signal modulation entries, such as a first signal modulation entry 708-1 or a second signal modulation entry 708-2 as explicitly depicted. Similarly, each signal modulation entry 708 can include multiple entries having one or more settings. As shown, each signal modulation entry (or field) 708 can include one or more of the following transmission entries: ET settings 310, DPD settings 134, TRX settings 312, amplifier settings 136, other settings for the RF front-end 128, other settings for the communication processor 124, and so forth.

Although depicted in certain manners in FIGS. 7-1 and 7-2, the transmission setting entries of a LUT 510 may be organized differently from the illustrated organization. For example, each signal modulation entry 708 may include multiple instances of an output power entry 706 instead of the opposite, as illustrated. The example table 700-2 of FIG. 7-2 may include signal modulation entries so a communication processor 124 can respond to a signal modulation change. Further, transmission settings may not be nested or may be only partially nested. Additionally, other transmission settings or transmission characteristics may be included, such as resource blocks.

At example table 700-2 of FIG. 7-2, a LUT 510 includes multiple frequency entries 704-1 and 704-2. For the first frequency entry 704-1, multiple output power entries 706-1 and 706-2 are shown, but the entry 704-1 may include more of such output power entries. Each respective output power entry 706-1 and 706-2 includes a respective set of amplifier settings 136-1 or 136-2. These amplifier settings 136 may differ from one another. For example, although each amplifier settings (entry) 136 is associated with a same or common gain 720, each amplifier setting entry may have one or more other setting(s) that differ responsive to the different associated output power between the first output power entry 706-1 and the second output power entry 706-2. For instance, a first supply voltage 724-1 may have a value that differs from a second supply voltage 724-2. Similarly, a first bias setting 726-1 may have a value that differs from a second bias setting 726-2 even with a gain 720 that is unchanged between the two output power levels—e.g., that provides a common gain 720 between the two or more output power levels.

In example implementations of a LUT 510, a first group 730-1 of amplifier settings (e.g., in the first amplifier settings 136-1) for an amplifier 132 are associated with a frequency (e.g., of the frequency entry 704-1), a first output power (e.g., of the first output power level 706-1), and a gain 720. The first group of amplifier settings 730-1 includes an amplifier bias setting 726-1 having a first value. A second group 730-2 of amplifier settings (e.g., in the second amplifier settings 136-2) for the amplifier 132 are associated with the frequency (e.g., of the first frequency entry 704-1), a second output power (e.g., of the second output power level 706-2), and the gain 720 (e.g., a same gain, a common gain, and/or an unchanged gain). The second group of amplifier settings 730-2 includes the amplifier bias setting 726-2 having a second value that is different from the first value. For instance, a quiescent current bias setting for a transistor of a power amplifier can have two different values for two different output power levels under a common gain. A numerical example like this is described with reference to FIG. 8-2 after a contrasting approach is described next with reference to FIG. 8-1.

FIG. 8-1 illustrates at 800-1 generally an alternative LUT having identical amplifier settings with changing output powers under a common gain. This pattern of values for multiple amplifier settings may result from a sequential determination of device settings, such as if the ET settings are determined first, followed by the amplifier settings, and then the DPD settings. At 801, two output power settings, "2" and "3," are indicated. Each respective output power corresponds to a row that includes multiple values. Example values for certain amplifier settings are indicated at 803. As shown, the values for a supply voltage, a first quiescent current, and a second quiescent current are identical between the row corresponding to the output power "2" and the row corresponding to the output power "3." In this example, such values are for components (e.g., amplifiers) in the RF front-end 128. Thus, in some examples, settings which are not indicative of a data signal itself (e.g., in contrast to "$V_{CC2}$" supplied by the ET amplifier 330) may be static in the RF front-end 128 (or just in the amplifier 132) while settings for other components (e.g., in the communication processor 124, such as $P_{sg}$, and/or the transceiver 126) vary when there is a common gain for the amplifier 132. This can result in higher power consumption as described below with reference to FIG. 9-1. In other examples, settings in the RF front-end 128 not mentioned here may vary.

FIG. 8-2 illustrates at 800-2 generally an example LUT 510 having varying amplifier settings with changing output powers under a common gain. This pattern of values for multiple amplifier settings can result from a joint determination of device transmission settings, and they can be used to implement transmission setting selection for increased power efficiency. At 802, two different output power settings, "2" and "3," are indicated. Each respective output power corresponds to a row that includes multiple values. The gain (G) is unchanged, or has a common gain index value of "2," across the two output powers.

Example values for amplifier settings are indicated at 804. As shown, at least some of the values for a supply voltage ($V_{CC1}$), a first quiescent current ($I_{Q1}$), or a second quiescent current ($I_{Q2}$) are different between the row corresponding to the output power "2" and the row corresponding to the output power "3." In the example of FIG. 8-2, the first quiescent current ($I_{Q1}$) differs between the two output power levels, but the second quiescent current ($I_{Q2}$) does not differ. In other words, the second quiescent current ($I_{Q2}$) has a same or common value across the "2" and "3" output power levels. The supply voltage ($V_{CC1}$), like the first quiescent current ($I_{Q1}$), differs between the two output power levels. Thus, the communication processor 124 can adjust these two amplifier settings (e.g., the supply voltage ($V_{CC1}$) and the first quiescent current ($I_{Q1}$)) responsive to an output power that is changed and a gain (G) (e.g., of the amplifier 132) that is unchanged (or a gain that is common to both output power levels). While in this example the second quiescent current ($I_{Q2}$) did not change, in other examples it could. Similarly, in other examples, the supply voltage ($V_{CC1}$) and/or a first quiescent current ($I_{Q1}$) may remain the same for a certain gain (G).

Employing an LUT 510 can enable the wireless interface device to adapt more quickly by responding to changes faster during operation. The LUT 510 stores values for settings that are precomputed—e.g., using a joint optimization procedure. When conditions change, the wireless interface device can access the LUT 510 and retrieve or select one or more settings from an entry corresponding to a new condition, such as a new output power. The retrieved or selected settings are then activated, e.g., in an amplifier or transceiver, to change the operation of the wireless interface device. This may be performed in as few as tens of milliseconds, or less (e.g., 5 ms, 1 ms). Thus, implementing precomputed settings using the LUT 510 can be faster than determining new settings iteratively "from scratch" as conditions change during operation, which may take 100s of milliseconds or more time.

Figures 1, 9:
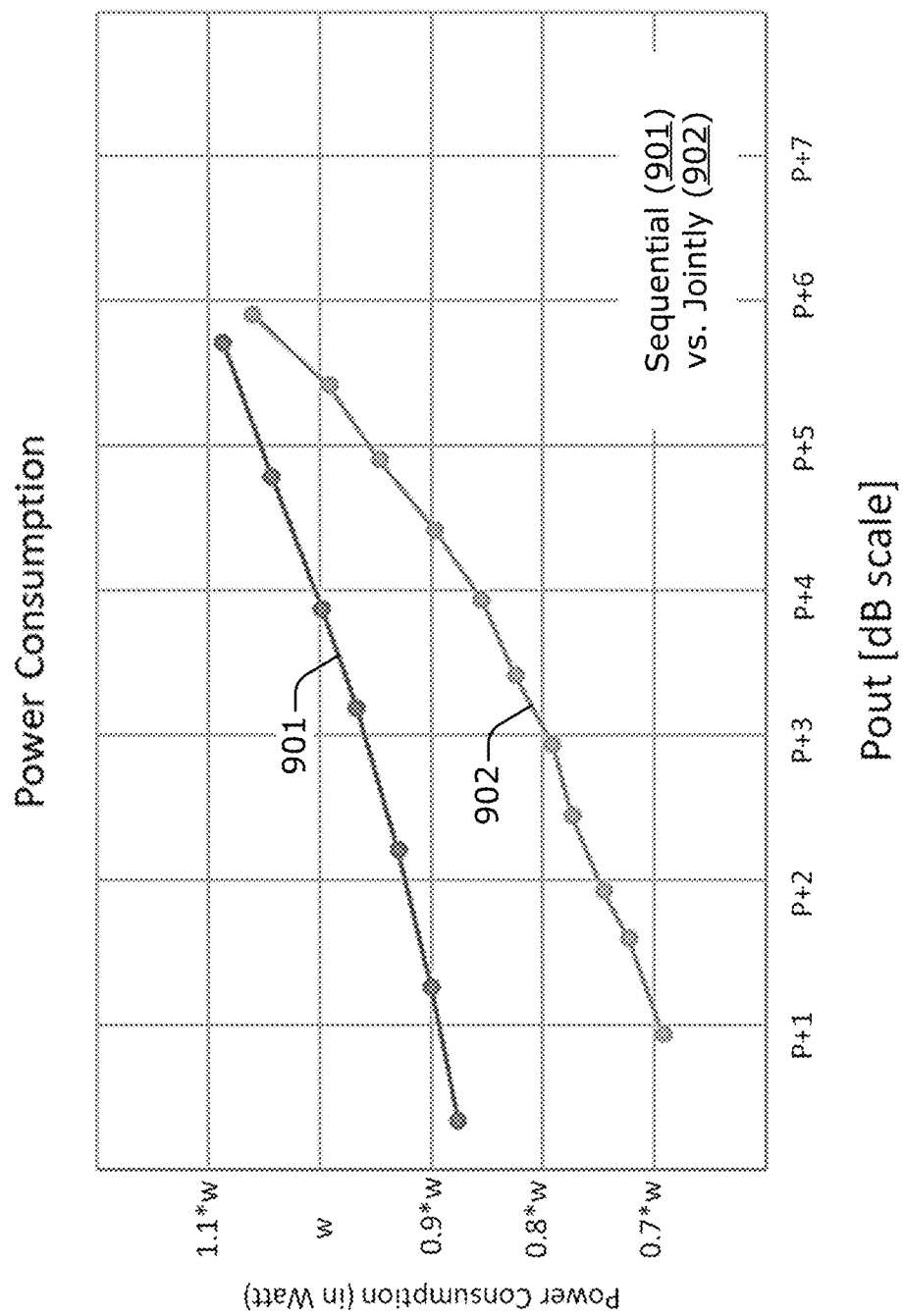
Figures 2, 9:
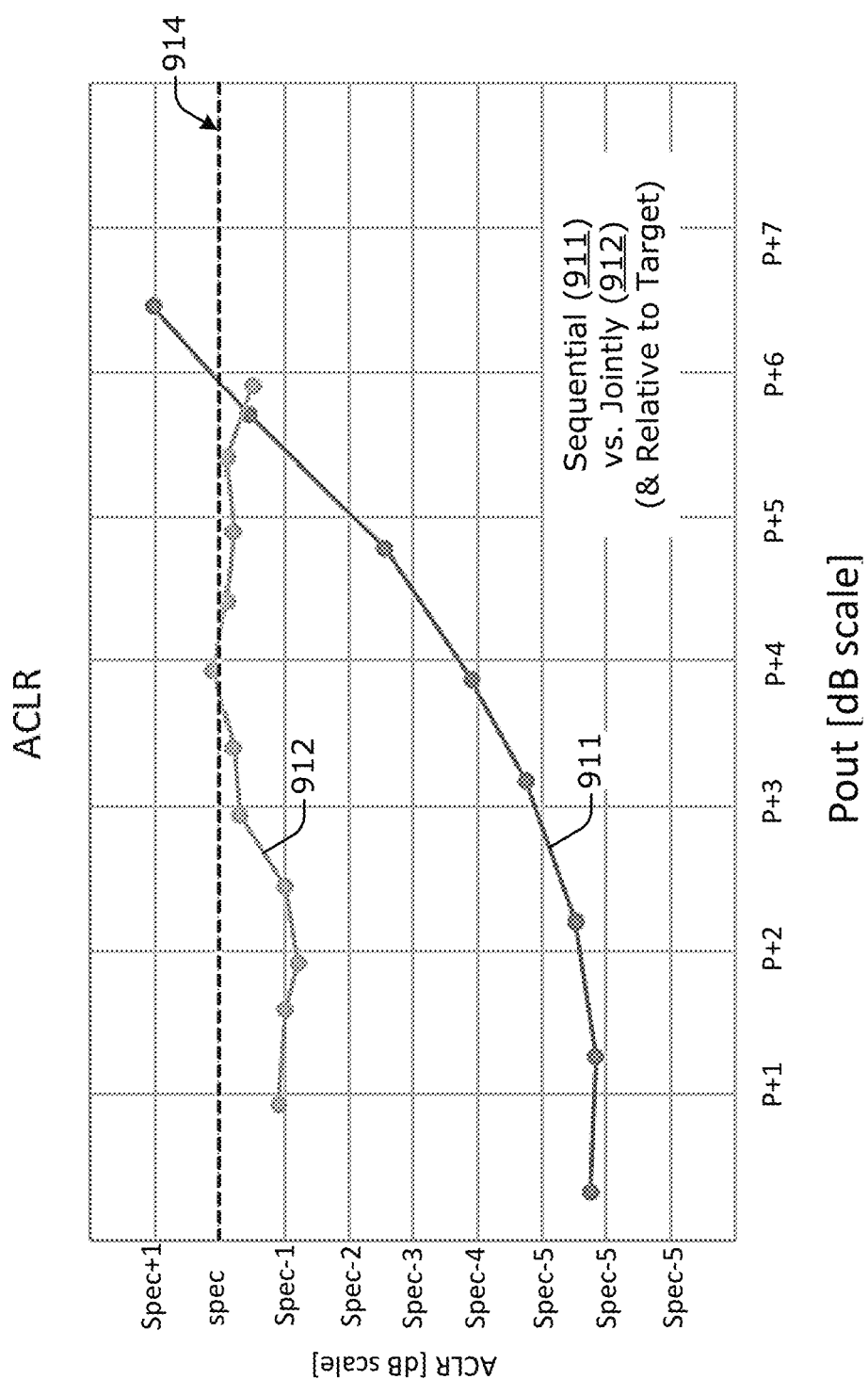
Figures 3, 9:
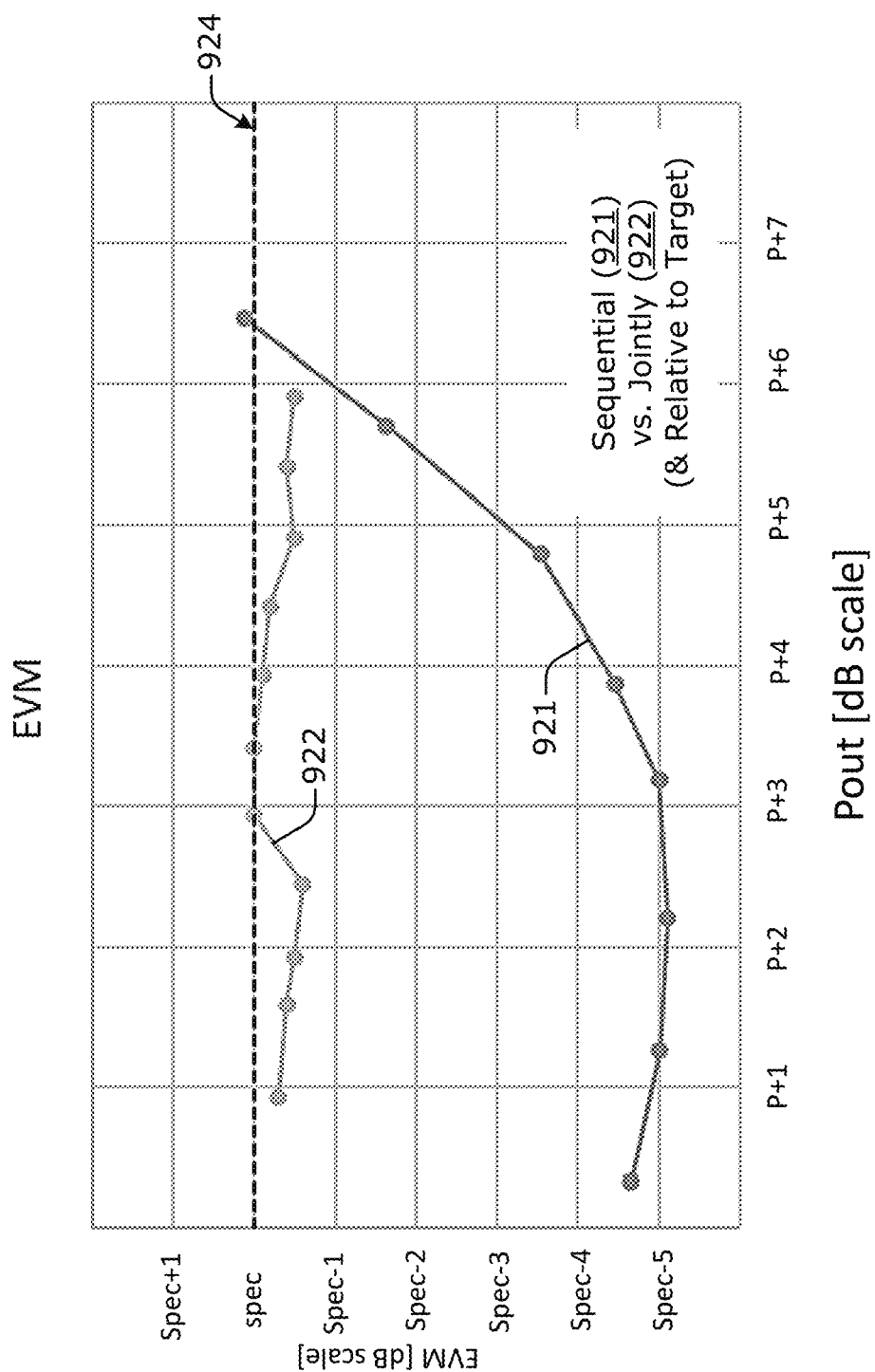
Figures 4, 9:
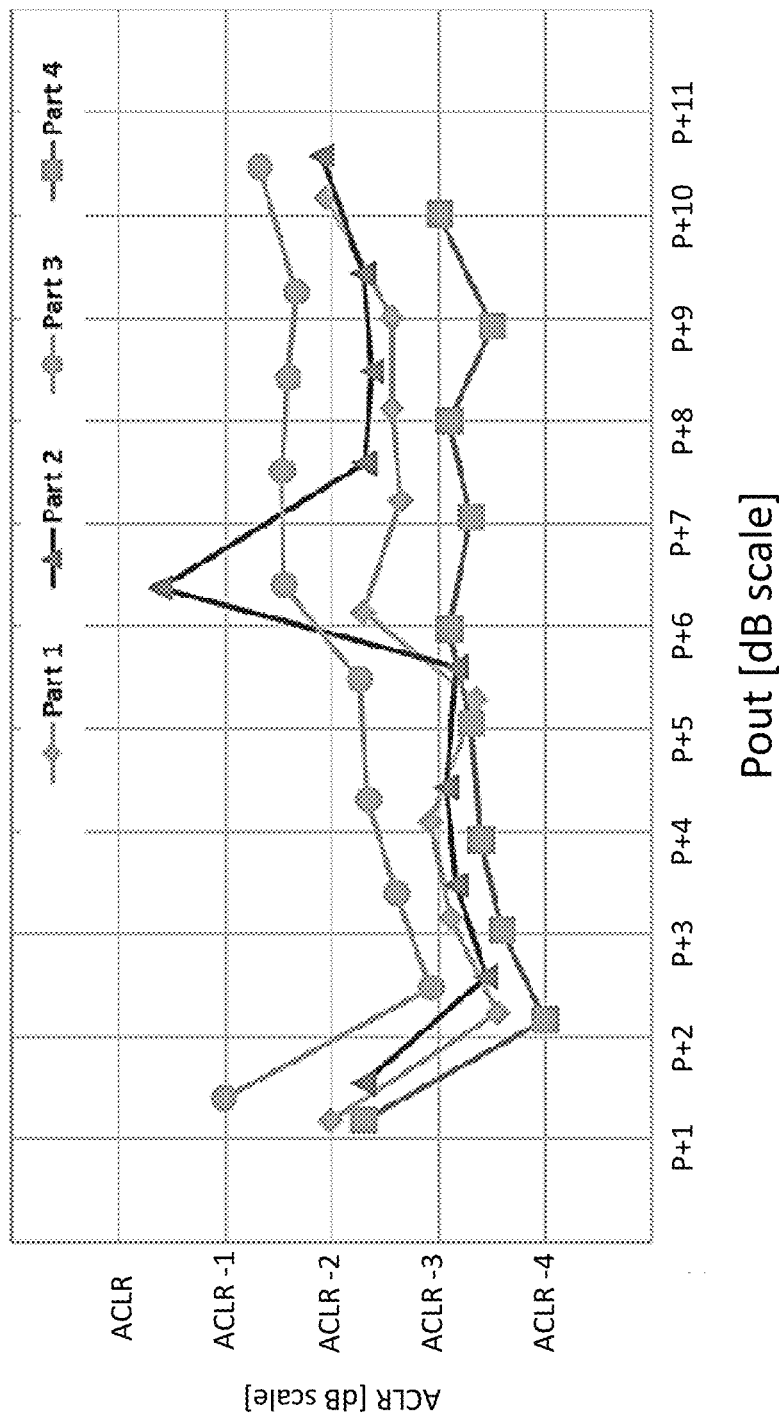

FIGS. 9-1 to 9-4 depict example graphs of certain operational metrics, such as power consumption, adjacent channel leakage ratio (ACLR), and error vector magnitude (EVM), each versus output power. In FIG. 9-1, an example graph 900-1 depicts power consumption (in watts (W)) versus output power (in decibels (dB)). The power consumption axis extends at least between "0.7*w" and "1.1*w," with w representing a given wattage. The output power (Pout) axis extends between at least "P+1" and "P+7," with P representing a given decibel level, and each increment along the abscissa axis increasing the decibel level by one decibel. A power consumption characteristic 902 corresponds to power consumption using settings that are determined jointly (e.g., using an optimization process). In contrast, a power consumption characteristic 901 corresponds to power consumption using settings that are determined sequentially (e.g., by sweeping values). The power consumption characteristic 902 corresponding to "optimized" transmission settings has a consistently lower power consumption value than that for the sequentially determined settings at each output power.

In FIG. 9-2, an example graph 900-2 depicts ACLR (in decibels (dB)) versus output power (in dB). The ACLR axis extends at least between "Spec−5" and "Spec+1," with Spec representing an example ACLR target 914. Thus, each horizontal line of the graph 900-2 represents a one-dB change relative to an adjacent horizontal line. The output power (Pout) axis extends between at least "P+1" and "P+7," with P representing a given decibel level, and each increment along the abscissa axis increasing the decibel level by one decibel. An ACLR characteristic 912 corresponds to ACLR results using transmission settings that are determined jointly (e.g., using an optimization process). In contrast, an ACLR characteristic 911 corresponds to ACLR results using settings that are determined sequentially.

Both characteristics are generally below the example ACLR target 914. Although the ACLR characteristic 911 resulting from sequential settings has a lower ACLR over much of the depicted output power range, the ACLR characteristic 912 is still predominantly below the ACLR target 914. Thus, using the "optimized" transmission settings sacrifices some ACLR headroom to improve power consumption (e.g., to lower power consumption by increasing at least power-added efficiency (PAE)). As shown in this example, the ACLR of the ACLR characteristic 912 is within approximately at least +/−2 dB (or even within +/−1 dB) of the ACLR target 914 along the output power range of interest. In some cases, the ACLR metric can be within approximately 20% (in terms of dB) of the ACLR target 914, including within 5% or 10% of the ACLR target 914, using jointly determined settings. For example, if the ACLR target 914 is −40 dB, the ACLR metric is within 10% of this target if it falls within −44 dB and −36 dB. If the ACLR target 914 is −20 dB, the ACLR metric is within 10% of this target if it is between −22 dB and −18 dB along the output power range of interest. Thus, the ACLR may be maintained relatively "flat" (or maintained to have a relatively small variation, such as less than 5%, for example) or exhibit a flat parameter profile across a range of expected output power levels of an amplifier (e.g., the amplifier 132) and/or a device 102 may be operated near (e.g., +/−1 dB, within 5%, etc. as described above) a target or limit over the (entire) range. In the example illustrated in FIG. 9-2, the range is approximately 7 decibels. The range, however, may be smaller (e.g., approximately 4 decibels or greater, or more than five or six), or larger (e.g., approximately 9 or 10 decibels or more).

In FIG. 9-3, an example graph 900-3 depicts EVM (in dB) versus output power (in dB). The EVM axis extends at least between "Spec−5" and "Spec+1," with Spec representing an example EVM target 924. Thus, each horizontal line of the graph 900-3 represents a one-dB change relative to an adjacent horizontal line. The output power (Pout) axis extends between at least "P+1" and "P+7," with P representing a given decibel level, and each vertical line along the abscissa axis increasing the decibel level by one decibel from left to right (as depicted). An EVM characteristic 922 corresponds to an EVM response using transmission settings that are determined jointly (e.g., using an optimization process). In contrast, an EVM characteristic 921 corresponds to an EVM response using settings that are determined sequentially.

Both characteristics are generally below the example EVM target 924. Although the EVM characteristic 921 resulting from sequential settings has a lower EVM over much of the depicted output power range, the EVM characteristic 922 is still predominantly below the EVM target 924. Thus, the "optimized" settings sacrifice some EVM headroom to improve power consumption (e.g., to lower power consumption or increase PAE). As shown in this example, the EVM values of the EVM characteristic 922 are within at least approximately +/−2 dB (or even within +/−1 dB) of the EVM target 924 along the output power range of interest. In some cases, the EVM metric can be within approximately 20% (in units of dB) of the EVM target 924, including within 5% or 10% of the EVM target 924, using jointly determined settings. For example, if the EVM target 924 is −40 dB, the EVM characteristic is within 10% of this target if the EVM metric has a value between −44 dB and −36 dB. If the EVM target 924 is −20 dB, the EVM metric is within 10% of this target if it is within a range of −22 dB and −18 dB in the output power range of interest. Similar to ACLR, EVM may therefore be maintained relatively "flat," or may exhibit a flat parameter profile, across a range of expected output power levels of an amplifier (e.g., the amplifier 132) and/or a device 102 may be operated near a target or limit over the (entire) range. In some examples, results similar to those depicted in FIGS. 9-2 and 9-3 (e.g., having a flat parameter profile) can be achieved for a common gain (e.g., as discussed above) for a certain range, which may be the same as or a subset of the range illustrated in these figures. In some examples, a gain is changed in order achieve the full range of Pout illustrated in these figures. For example, a first gain may be used for Pout less than P+3, and another gain for Pout of P+3 or greater. The flat parameter profile may be maintained within each sub-range (where the same gain is used to achieve all of the Pout in the sub-range), as well as when switching between sub-ranges/gains.

In FIG. 9-4, an example graph 900-4 depicts ACLR (in dB) versus output power (Pout) (in dB) across four sample parts: part 1, part 2, part 3, and part 4. The ACLR results of these four parts are indicated by respective shapes: diamond, triangle, circle, and square. The ACLR axis extends at least between "ACLR−4" and "ACLR," with ACLR representing an arbitrary decibel level. Thus, each horizontal line of the graph 900-4 represents a one-dB change relative to an adjacent horizontal line. The output power (Pout) axis extends between at least "P+1" and "P+11," with P representing a given decibel level. Each vertical line along the abscissa axis increases the decibel level by one decibel from left to right (as depicted).

As shown, the four parts span less than a four-dB range of ACLR across the example output power range of interest. Thus, the ACLR varies by no more than approximately 2 dB from the middle of the four-dB range (e.g., from the "ACLR−2" level). If, for instance, the "ACLR−2" level corresponds to −40 dB, the ACLR range of the example parts fall within +/−5% of the median in units of decibels (e.g., +/−2 dB of −40 dB). In other cases, the variance may be 1 dB or 3 dB, for example, from a median metric value. In alternative implementations, parts may be configured in accordance with EVM—e.g., if EVM performance is prioritized over that of ACLR as the key performance indicator (KPI). Thus, operations described herein can be used to improve or optimize performance of different parts for a given KPI or set of KPIs. Although certain example metrics and example values have been described above and depicted in the graphs of FIGS. 9-1 to 9-4, other metrics, values, ranges, and/or relative proportions/percentages may be employed or produced based on particular optimization goals.

Figure 10:
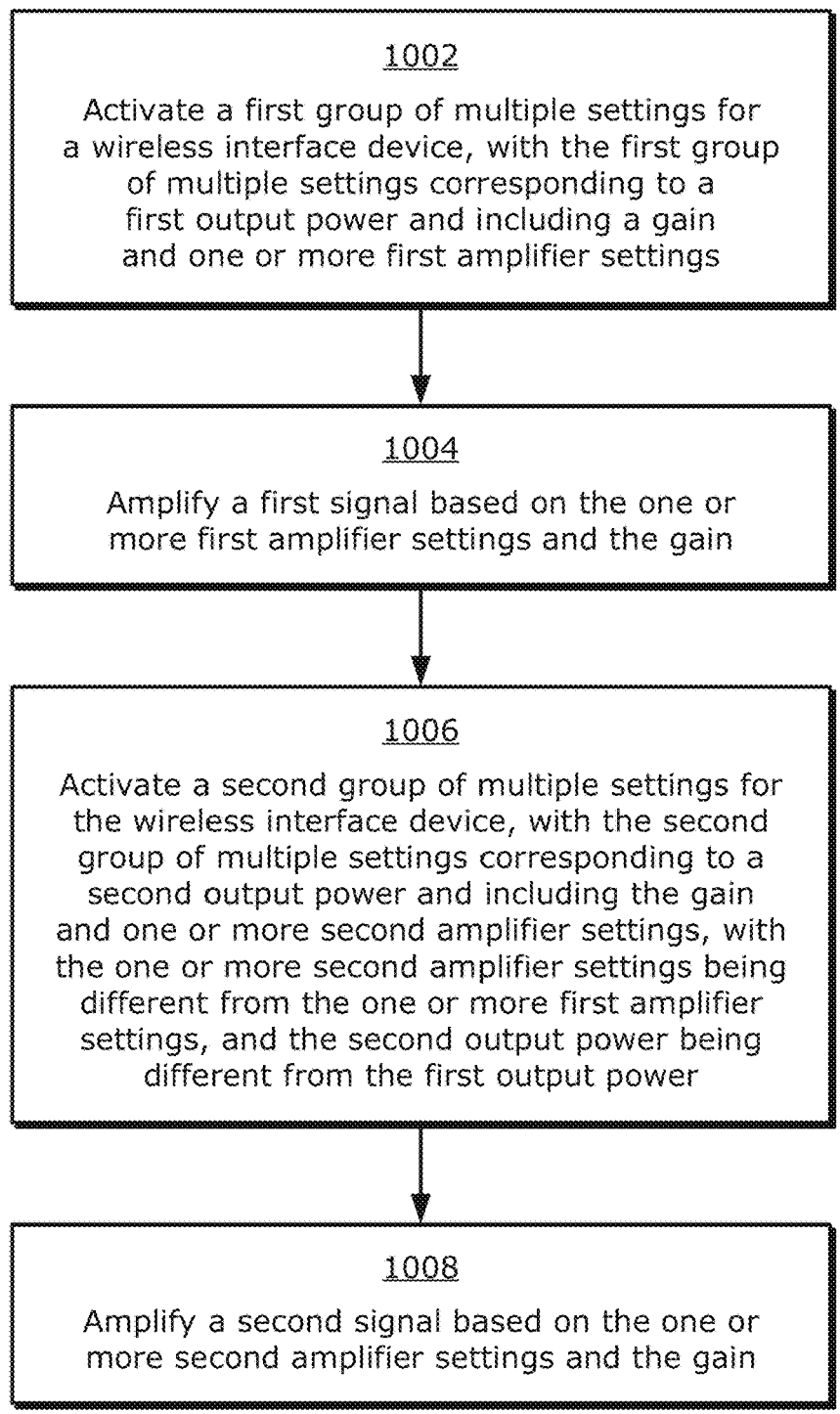
FIG. 10 is a flow diagram illustrating an example process for transmission setting selection.

FIG. 10 is a flow diagram illustrating an example process 1000 for transmission setting selection. The process 1000 is described in the form of a set of blocks 1002-1008 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000 or an alternative process. Operations represented by the illustrated blocks of the process 1000 may be performed by an electronic device 102, including by a wireless interface device 120 thereof. More specifically, the operations of the process 1000 may be performed by at least a communication processor 124 and an RF front-end 128, including an amplifier 132 of the RF front-end 128.

At block 1002, an electronic device is activating a first group of multiple settings for a wireless interface device, with the first group of multiple settings corresponding to a first output power and including a gain and one or more first amplifier settings. For example, a wireless interface device 120 of an electronic device 102 can activate a first group of multiple settings for the wireless interface device 120, with the first group of multiple settings corresponding to a first output power 706-1 and including a gain 720 and one or more first amplifier settings 136-1. For instance, a communication processor 124 of the wireless interface device 120 may activate a first group of multiple transmission settings (e.g., the gain 720 and a first supply voltage 724-1 and/or a first bias setting 726-1 of the first amplifier settings 136-1) of the first output power 706-1 by accessing a LUT 510 and providing commands to an amplifier 132 of an RF front-end 128 based on values stored in the LUT 510.

At block 1004, the electronic device is amplifying a first signal based on the one or more first amplifier settings and the gain. For example, the RF front-end 128 can amplify a first signal 214 based on the one or more first amplifier settings 136-1 and the gain 720. In some cases, the amplifier 132 may amplify a digitally pre-distorted signal or a non-pre-distorted signal 214 using a first amplifier 332-1 having one quiescent current ($I_{Q1}$) and a second amplifier 332-2 that is being powered by a specified supply voltage ($V_{CC1}$).

At block 1006, the electronic device is activating a second group of multiple settings for the wireless interface device, with the second group of multiple settings corresponding to a second output power and including the gain and one or more second amplifier settings. Here, the one or more second amplifier settings are different from the one or more first amplifier settings, and the second output power is different from the first output power. For example, the wireless interface device 120 can activate a second group of multiple settings for the wireless interface device 120, with the second group of multiple settings corresponding to a second output power 706-2 and including the gain 720 and one or more second amplifier settings 136-2. The one or more second amplifier settings 136-2 are different from the one or more first amplifier settings 136-1, and the second output power 706-2 is different from the first output power 706-1. To do so, the communication processor 124 may activate a second group of multiple transmission settings (e.g., the gain 720 and a second supply voltage 724-2 and/or a second bias setting 726-2 of the second amplifier settings 136-2) of the second output power 706-2 by accessing the LUT 510. By providing commands to the amplifier 132 based on the values of the second group of multiple transmission settings, the communication processor 124 may adjust the amplifier settings based on an output power change and a gain that is unchanged.

At block 1008, the electronic device is amplifying a second signal based on the one or more second amplifier settings and the gain. For example, the RF front-end 128 can amplify a second signal 214 based on the one or more second amplifier settings 136-2 and the gain 720. Thus, the amplifier 132 may amplify a digitally pre-distorted signal or a non-pre-distorted signal 214 using the first amplifier 332-1 having another quiescent current ($I_{Q1}$) and/or using the second amplifier 332-2 that is being powered by an adjusted supply voltage ($V_{CC1}$).

In some implementations, the amplifying of the first signal based on the one or more first amplifier settings includes amplifying the first signal having a first signal modulation (e.g., a first signal modulation 708-1). Responsive to a signal modulation change, the communication processor 124 can access the LUT 510 and may adjust one or more transmission settings. Thus, the process 1000 can also include activating a third group of multiple settings for the wireless interface device 120. The third group of multiple settings corresponds to the first output power 706-1 and includes the gain and one or more third amplifier settings. Here, the one or more third amplifier settings are different from the one or more first amplifier settings due to a different signal modulation being used. The process may further include amplifying a third signal having a second signal modulation (e.g., of a second signal modulation 708-2) based on the one or more third amplifier settings and the gain, with the second signal modulation being different from the first signal modulation as per the signal modulation change. In other implementations, a wireless interface device 120 can perform an analogous set of operations if the communication processor 124 is selectively engaging or disengaging a digital pre-distorter 130, and the LUT 510 includes different transmission settings for engagement versus disengagement of the digital pre-distorter 130.

This section describes some aspects of example implementations and/or example configurations related to the apparatuses and/or processes presented above.

Example aspect 1: An apparatus comprising:
a wireless interface device comprising:
  a communication processor configured to provide a signal; and
  a radio-frequency front-end coupled to the communication processor and configured to accept the signal, the radio-frequency front-end comprising an amplifier configured to amplify the signal based on one or more amplifier settings,
  the wireless interface device configured to adjust the one or more amplifier settings responsive to an output power being changed with a gain being unchanged.

Example aspect 2: The apparatus of example aspect 1, wherein:
the one or more amplifier settings comprise at least one amplifier bias setting.

Example aspect 3: The apparatus of example aspect 2, wherein:
the at least one amplifier bias setting comprises a quiescent current of a transistor.

Example aspect 4: The apparatus of example aspect 3, wherein:
the amplifier comprises a first amplifier comprising a first transistor and a second amplifier comprising a second transistor;
the quiescent current comprises a first quiescent current of the first transistor and a second quiescent current of the second transistor; and
the wireless interface device is configured to adjust the first quiescent current and to maintain the second quiescent current unadjusted responsive to the output power being changed with the gain being unchanged.

Example aspect 5: The apparatus of any one of the preceding example aspects, wherein:
the one or more amplifier settings comprise at least one supply voltage setting.

Example aspect 6: The apparatus of any one of the preceding example aspects, wherein the communication processor comprises at least one look-up table comprising:
a first portion corresponding to multiple settings for the radio-frequency front-end in which the multiple settings are determined separately from other settings of the wireless interface device; and
a second portion corresponding to the multiple settings for the radio-frequency front-end in which the multiple settings are determined jointly with the other settings of the wireless interface device.

Example aspect 7: The apparatus of example aspect 6, wherein:
the communication processor comprises a digital pre-distorter (DPD) configured to pre-distort at least one signal using one or more DPD settings to produce at least one pre-distorted signal; and
the other settings comprise the one or more DPD settings of the digital pre-distorter.

Example aspect 8: The apparatus of any one of the preceding example aspects, wherein the communication processor comprises at least one look-up table comprising:
a first group of amplifier settings for the amplifier, the first group of amplifier settings associated with a frequency, a first output power, and a common gain, the first group of amplifier settings comprising an amplifier bias setting having a first value; and
a second group of amplifier settings for the amplifier, the second group of amplifier settings associated with the frequency, a second output power, and the common gain, the second group of amplifier settings comprising the amplifier bias setting having a second value that is different from the first value.

Example aspect 9: The apparatus of any one of the preceding example aspects, wherein the wireless interface device is configured to:
adjust the one or more amplifier settings responsive to a signal modulation change with the output power and the gain being unchanged.

Example aspect 10: The apparatus of any one of the preceding example aspects, wherein:
the communication processor comprises a digital pre-distorter (DPD) configured to pre-distort signals, including the signal provided to the radio-frequency front-end, using one or more DPD settings;
the communication processor is configured to selectively disengage the digital pre-distorter;
the communication processor is configured to produce another signal with the digital pre-distorter disengaged;
the wireless interface device is configured to adjust the one or more amplifier settings to produce one or more adjusted amplifier settings responsive to disengagement of the digital pre-distorter with the output power and the gain being unchanged; and
the radio-frequency front-end is configured to accept the other signal, and the amplifier is configured to amplify the other signal based on the one or more adjusted amplifier settings.

Example aspect 11: The apparatus of any one of the preceding example aspects, wherein:
the communication processor comprises an envelope tracker (ET) configured to track an envelope of the signal based on one or more ET settings to produce an envelope-tracking signal;
the communication processor is configured to provide the envelope-tracking signal to the radio-frequency front-end; and
the amplifier is configured to amplify the signal based on the envelope-tracking signal.

Example aspect 12: The apparatus of example aspect 11, wherein:
the radio-frequency front-end comprises an envelope tracking amplifier configured to:
produce a voltage based on the envelope-tracking signal; and
provide the voltage to the amplifier; and
the amplifier is configured to use the voltage as at least one supply voltage.

Example aspect 13: The apparatus of example aspect 11 or example aspect 12, wherein:
the communication processor comprises a digital pre-distorter (DPD) configured to pre-distort at least one signal using one or more DPD settings to produce at least one pre-distorted signal; and
the one or more amplifier settings result from an operation that jointly determines the one or more DPD settings, the one or more amplifier settings, and the one or more ET settings.

Example aspect 14: The apparatus of example aspect 13, wherein:
the operation comprises a discrete optimization process that relates to power efficiency and that uses at least one constraint.

Example aspect 15: The apparatus of any one of the preceding example aspects, wherein:
the communication processor comprises a digital pre-distorter (DPD) configured to pre-distort at least one signal using one or more DPD settings to produce at least one pre-distorted signal;
the wireless interface device comprises a transceiver coupled between the communication processor and the radio-frequency front-end;
the communication processor is configured to provide the at least one pre-distorted signal to the radio-frequency front-end via the transceiver;
the transceiver is configured to process the at least one pre-distorted signal using one or more transceiver settings; and
the transceiver is configured to provide the at least one pre-distorted signal to the radio-frequency front-end as processed by the transceiver as the signal.

Example aspect 16: The apparatus of example aspect 15, wherein:
the one or more transceiver settings result from an operation that jointly determines the one or more DPD settings, the one or more amplifier settings, and the one or more transceiver settings.

Example aspect 17: The apparatus of any one of the preceding example aspects, wherein the communication processor comprises:
a digital pre-distorter (DPD) configured to pre-distort at least one signal using one or more DPD settings to produce at least one pre-distorted signal; and
a setting tuner configured to tune the one or more amplifier settings jointly with the one or more DPD settings.

Example aspect 18: The apparatus of example aspect 17, wherein:
the wireless interface device comprises a feedback receiver coupled to the amplifier, the feedback receiver configured to provide at least one signal to the setting tuner based on an output signal of the amplifier; and
the wireless interface device is configured to adjust the one or more amplifier settings responsive to the output power being unchanged and with the gain being unchanged based on a tuning operation performed by the setting tuner.

Example aspect 19: The apparatus of example aspect 17 or example aspect 18, wherein:
the setting tuner is configured to tune the one or more amplifier settings based on at least power-added efficiency (PAE) and responsive to one or more constraints.

Example aspect 20: The apparatus of example aspect 19, wherein:
the one or more constraints are related to at least one of error vector magnitude (EVM) or adjacent channel leakage ratio (ACLR).

Example aspect 21: The apparatus of any one of the preceding example aspects, wherein:
the wireless interface device is configured to transmit at least one signal over a range of output powers while maintaining a flat profile for an adjacent channel leakage ratio (ACLR) parameter.

Example aspect 22: The apparatus of any one of the preceding example aspects, wherein:
the wireless interface device is configured to transmit at least one signal over a range of output powers while maintaining a flat profile for an error vector magnitude (EVM) parameter.

Example aspect 23: The apparatus of any one of the preceding example aspects, further comprising:
at least one antenna coupled to the wireless interface device;

a display screen; and at least one processor operatively coupled to the display screen and at least a portion of the wireless interface device, the at least one processor configured to present one or more graphical images on the display screen based on one or more wireless signals transmitted using the amplifier of the radio-frequency front-end and the at least one antenna.

Example aspect 24: An apparatus for selecting efficient transmission settings, the apparatus comprising:

means for activating a first group of multiple settings for a wireless interface device, the first group of multiple settings corresponding to a first output power and comprising a gain and one or more first amplifier settings;

means for amplifying a first signal based on the one or more first amplifier settings and the gain;

means for activating a second group of multiple settings for the wireless interface device, the second group of multiple settings corresponding to a second output power and comprising the gain and one or more second amplifier settings, the one or more second amplifier settings different from the one or more first amplifier settings; and means for amplifying a second signal based on the one or more second amplifier settings and the gain.

Example aspect 25: A method for selecting efficient transmission settings, the method comprising:

activating a first group of multiple settings for a wireless interface device, the first group of multiple settings corresponding to a first output power and comprising a gain and one or more first amplifier settings;

amplifying a first signal based on the one or more first amplifier settings and the gain;

activating a second group of multiple settings for the wireless interface device, the second group of multiple settings corresponding to a second output power and comprising the gain and one or more second amplifier settings, the one or more second amplifier settings different from the one or more first amplifier settings, the second output power different from the first output power; and amplifying a second signal based on the one or more second amplifier settings and the gain.

Example aspect 26: The method of example aspect 25, wherein:

the amplifying of the first signal based on the one or more first amplifier settings comprises amplifying the first signal based on a first quiescent current for an amplifier; and the amplifying of the second signal based on the one or more second amplifier settings comprises amplifying the second signal based on a second quiescent current for the amplifier, the second quiescent current different from the first quiescent current.

Example aspect 27: The method of example aspect 25 or example aspect 26, wherein:

the amplifying of the first signal based on the one or more first amplifier settings comprises amplifying the first signal having a first signal modulation; and the method further comprises:

activating a third group of multiple settings for the wireless interface device, the third group of multiple settings corresponding to the first output power and comprising the gain and one or more third amplifier settings, the one or more third amplifier settings different from the one or more first amplifier settings; and amplifying a third signal having a second signal modulation based on the one or more third amplifier settings and the gain, the second signal modulation different from the first signal modulation.

Example aspect 28: The method of any one of the example aspects 25-27, wherein:

the amplifying of the first signal based on the one or more first amplifier settings comprises amplifying the first signal that is digitally pre-distorted; and the method further comprises:

activating a third group of multiple settings for the wireless interface device, the third group of multiple settings corresponding to the first output power and comprising the gain and one or more third amplifier settings, the one or more third amplifier settings different from the one or more first amplifier settings; and amplifying a third signal that is not digitally pre-distorted based on the one or more third amplifier settings and the gain.

Example aspect 29: An apparatus comprising:

a wireless interface device comprising:

a communication processor comprising a digital pre-distorter (DPD) configured to pre-distort a signal using one or more DPD settings to produce a pre-distorted signal; and a radio-frequency front-end coupled to the communication processor and configured to accept the pre-distorted signal, the radio-frequency front-end comprising an amplifier configured to amplify the pre-distorted signal based on one or more amplifier settings, the wireless interface device configured to adjust the one or more DPD settings responsive to an output power being changed with a gain being unchanged.

Example aspect 30: The apparatus of example aspect 29, wherein the wireless interface device is configured to:

adjust the one or more DPD settings responsive to a signal modulation change with the output power and the gain being unchanged.

As used herein, the terms "couple," "coupled," or "coupling" refer to a relationship between two or more components that are in operative communication with each other to implement some feature or realize some capability that is described herein. A galvanic coupling can be realized using, for instance, a physical line, such as a metal trace or wire. A galvanic or electromagnetic coupling can include a direct coupling or an indirect coupling. A direct coupling refers to connecting circuit elements via a same node without an intervening element. An indirect coupling refers to connecting circuit elements via one or more other devices or other circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first output power" or a "first quiescent current" in one context may be identified as a "third output power" or a "second quiescent current," respectively, in another context. Similarly, "one or more amplifier settings" in one claim may be different from "one or more amplifier settings" in another claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
a wireless interface device comprising:
a communication processor configured to provide a signal; and
a radio-frequency front-end coupled to the communication processor and configured to accept the signal, the radio-frequency front-end comprising an amplifier configured to amplify the signal based on one or more amplifier settings,
the wireless interface device configured to adjust the one or more amplifier settings responsive to an output power setting being changed with a gain being unchanged.

2. The apparatus of claim 1, wherein:
the one or more amplifier settings comprise at least one amplifier bias setting.

3. The apparatus of claim 2, wherein:
the at least one amplifier bias setting comprises a quiescent current of a transistor.

4. The apparatus of claim 3, wherein:
the amplifier comprises a first amplifier comprising a first transistor and a second amplifier comprising a second transistor;
the quiescent current comprises a first quiescent current of the first transistor and a second quiescent current of the second transistor; and
the wireless interface device is configured to adjust the first quiescent current and to maintain the second quiescent current unadjusted responsive to the output power setting being changed with the gain being unchanged.

5. The apparatus of claim 1, wherein:
the one or more amplifier settings comprise at least one supply voltage setting.

6. The apparatus of claim 1, wherein the communication processor comprises at least one look-up table comprising:
a first portion corresponding to multiple settings for the radio-frequency front-end in which the multiple settings are determined separately from other settings of the wireless interface device; and
a second portion corresponding to the multiple settings for the radio-frequency front-end in which the multiple settings are determined jointly with the other settings of the wireless interface device.

7. The apparatus of claim 6, wherein:
the communication processor comprises a digital pre-distorter (DPD) configured to pre-distort at least one signal using one or more DPD settings to produce at least one pre-distorted signal; and
the other settings comprise the one or more DPD settings of the digital pre-distorter.

8. The apparatus of claim 1, wherein the communication processor comprises at least one look-up table comprising:
a first group of amplifier settings for the amplifier, the first group of amplifier settings associated with a frequency, a first output power, and a common gain, the first group of amplifier settings comprising an amplifier bias setting having a first value; and
a second group of amplifier settings for the amplifier, the second group of amplifier settings associated with the frequency, a second output power, and the common gain, the second group of amplifier settings comprising the amplifier bias setting having a second value that is different from the first value.

9. The apparatus of claim 1, wherein the wireless interface device is configured to:
adjust the one or more amplifier settings responsive to a signal modulation change with the output power setting and the gain being unchanged.

10. The apparatus of claim 1, wherein:
the communication processor comprises a digital pre-distorter (DPD) configured to pre-distort signals, including the signal provided to the radio-frequency front-end, using one or more DPD settings;
the communication processor is configured to selectively disengage the digital pre-distorter;
the communication processor is configured to produce another signal with the digital pre-distorter disengaged;
the wireless interface device is configured to adjust the one or more amplifier settings to produce one or more adjusted amplifier settings responsive to disengagement of the digital pre-distorter with the output power setting and the gain being unchanged; and
the radio-frequency front-end is configured to accept the other signal, and the amplifier is configured to amplify the other signal based on the one or more adjusted amplifier settings.

11. The apparatus of claim 1, wherein:
the communication processor comprises an envelope tracker (ET) configured to track an envelope of the signal based on one or more ET settings to produce an envelope-tracking signal;
the communication processor is configured to provide the envelope-tracking signal to the radio-frequency front-end; and
the amplifier is configured to amplify the signal based on the envelope-tracking signal.

12. The apparatus of claim 11, wherein:
the radio-frequency front-end comprises an envelope tracking amplifier configured to:
produce a voltage based on the envelope-tracking signal; and
provide the voltage to the amplifier; and
the amplifier is configured to use the voltage as at least one supply voltage.

13. The apparatus of claim 11, wherein:
the communication processor comprises a digital pre-distorter (DPD) configured to pre-distort at least one signal using one or more DPD settings to produce at least one pre-distorted signal; and
the one or more amplifier settings result from an operation that jointly determines the one or more DPD settings, the one or more amplifier settings, and the one or more ET settings.

14. The apparatus of claim 13, wherein:
the operation comprises a discrete optimization process that relates to power efficiency and that uses at least one constraint.

15. The apparatus of claim 1, wherein:
the communication processor comprises a digital pre-distorter (DPD) configured to pre-distort at least one signal using one or more DPD settings to produce at least one pre-distorted signal;
the wireless interface device comprises a transceiver coupled between the communication processor and the radio-frequency front-end;
the communication processor is configured to provide the at least one pre-distorted signal to the radio-frequency front-end via the transceiver;
the transceiver is configured to process the at least one pre-distorted signal using one or more transceiver settings; and
the transceiver is configured to provide the at least one pre-distorted signal to the radio-frequency front-end as processed by the transceiver as the signal.

16. The apparatus of claim 15, wherein:
the one or more transceiver settings result from an operation that jointly determines the one or more DPD settings, the one or more amplifier settings, and the one or more transceiver settings.

17. The apparatus of claim 1, wherein the communication processor comprises:
a digital pre-distorter (DPD) configured to pre-distort at least one signal using one or more DPD settings to produce at least one pre-distorted signal; and
a setting tuner configured to tune the one or more amplifier settings jointly with the one or more DPD settings.

18. The apparatus of claim 17, wherein:
the wireless interface device comprises a feedback receiver coupled to the amplifier, the feedback receiver configured to provide at least one signal to the setting tuner based on an output signal of the amplifier; and
the wireless interface device is configured to adjust the one or more amplifier settings responsive to the output power setting being unchanged and with the gain being unchanged based on a tuning operation performed by the setting tuner.

19. The apparatus of claim 17, wherein:
the setting tuner is configured to tune the one or more amplifier settings based on at least power-added efficiency (PAE) and responsive to one or more constraints.

20. The apparatus of claim 19, wherein:
the one or more constraints are related to at least one of error vector magnitude (EVM) or adjacent channel leakage ratio (ACLR).

21. The apparatus of claim 1, wherein:
the wireless interface device is configured to transmit at least one signal over a range of output powers while maintaining a flat profile for an adjacent channel leakage ratio (ACLR) parameter.

22. The apparatus of claim 1, wherein:
the wireless interface device is configured to transmit at least one signal over a range of output powers while maintaining a flat profile for an error vector magnitude (EVM) parameter.

23. The apparatus of claim 1, further comprising:
at least one antenna coupled to the wireless interface device;
a display screen; and
at least one processor operatively coupled to the display screen and at least a portion of the wireless interface device, the at least one processor configured to present one or more graphical images on the display screen based on one or more wireless signals transmitted using the amplifier of the radio-frequency front-end and the at least one antenna.

24. The apparatus of claim 1, wherein:
the gain being unchanged comprises a gain setting being unchanged.

25. The apparatus of claim 1, wherein:
the gain being unchanged comprises a gain index value being unchanged.

26. An apparatus comprising:
a wireless interface device comprising:
a communication processor comprising a digital pre-distorter (DPD) configured to pre-distort a signal using one or more DPD settings to produce a pre-distorted signal; and
a radio-frequency front-end coupled to the communication processor and configured to accept the pre-distorted signal, the radio-frequency front-end comprising an amplifier configured to amplify the pre-distorted signal based on one or more amplifier settings,
the wireless interface device configured to adjust the one or more DPD settings responsive to an output power being changed with a gain being unchanged.

27. The apparatus of claim 26, wherein the wireless interface device is configured to:
adjust the one or more DPD settings responsive to a signal modulation change with the output power and the gain being unchanged.

28. The apparatus of claim 26, wherein:
the output power being changed comprises an output power setting being unchanged, and the gain being unchanged comprises a gain setting or a gain index value being unchanged.

29. An apparatus comprising:
a wireless interface device comprising:
a communication processor configured to provide a signal; and
a radio-frequency front-end coupled to the communication processor and configured to accept the signal, the radio-frequency front-end comprising an amplifier configured to amplify the signal based on one or more amplifier settings,
the wireless interface device configured to adjust the one or more amplifier settings responsive to an output power being changed with a gain being unchanged,
wherein the wireless interface device is configured to transmit at least one signal over a range of output powers while maintaining a flat profile for an adjacent channel leakage ratio (ACLR) parameter.

30. An apparatus comprising:
a wireless interface device comprising:
- a communication processor configured to provide a signal; and
- a radio-frequency front-end coupled to the communication processor and configured to accept the signal, the radio-frequency front-end comprising an amplifier configured to amplify the signal based on one or more amplifier settings,//
- the wireless interface device configured to adjust the one or more amplifier settings responsive to an output power being changed with a gain being unchanged, wherein the wireless interface device is configured to transmit at least one signal over a range of output powers while maintaining a flat profile for an error vector magnitude (EVM) parameter.

* * * * *